(12) United States Patent
Lee et al.

(10) Patent No.: US 10,411,164 B2
(45) Date of Patent: Sep. 10, 2019

(54) LIGHT-EMITTING ELEMENT HAVING ZNO TRANSPARENT ELECTRODE AND METHOD FOR MANUFACTURING SAME

(71) Applicant: SEOUL VIOSYS CO., LTD., Ansan-si (KR)

(72) Inventors: Jin Woong Lee, Ansan-si (KR); Chan Seob Shin, Ansan-si (KR); Keum Ju Lee, Ansan-si (KR); Seom Geun Lee, Ansan-si (KR); Myoung Hak Yang, Ansan-si (KR); Jacob J. Richardson, Santa Barbara, CA (US); Evan C. O'Hara, Santa Barbara, CA (US)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/757,636

(22) PCT Filed: Aug. 23, 2016

(86) PCT No.: PCT/KR2016/009302
§ 371 (c)(1),
(2) Date: Jul. 24, 2018

(87) PCT Pub. No.: WO2017/039208
PCT Pub. Date: Mar. 9, 2017

(65) Prior Publication Data
US 2018/0323346 A1    Nov. 8, 2018

(30) Foreign Application Priority Data

Sep. 3, 2015    (KR) .................. 10-2015-0125058
Sep. 4, 2015    (KR) .................. 10-2015-0125571
Sep. 22, 2015   (KR) .................. 10-2015-0134034

(51) Int. Cl.
*H01L 33/42*    (2010.01)
*G02F 1/1335*   (2006.01)
(Continued)

(52) U.S. Cl.
CPC ........ *H01L 33/42* (2013.01); *G02F 1/133603* (2013.01); *H01L 33/10* (2013.01);
(Continued)

(58) Field of Classification Search
CPC . G02F 1/133603; H01L 33/10; H01L 33/325; H01L 33/387; H01L 33/42; H01L 33/62
See application file for complete search history.

(56) References Cited

U.S. PATENT DOCUMENTS 6,057,561 A * 5/2000 Kawasaki ........... H01L 33/0087
257/103
2007/0158661 A1   7/2007 Lu et al.
(Continued)

FOREIGN PATENT DOCUMENTS

JP    2009-295868 A    12/2009
JP    2011-205076 A    10/2011
(Continued)

OTHER PUBLICATIONS

International Search Report in International Application No. PCT/KR2016/0093202, dated Dec. 6, 2016.
(Continued)

*Primary Examiner* — Allan R Wilson
(74) *Attorney, Agent, or Firm* — Perkins Coie LLP

(57) ABSTRACT

A light-emitting electrode having a ZnO transparent electrode and a method for manufacturing the same are provided. A light-emitting element according to an embodiment comprises: a light-emitting structure comprising a first conductive semiconductor layer, an active layer, and a second conductive semiconductor layer; and a ZnO transparent
(Continued)

electrode, which is positioned on the second conductive semiconductor layer, which makes an Ohmic contact with the second conductive semiconductor layer, and which comprises monocrystalline ZnO, wherein the diffraction angle of a peak of the ZnO transparent electrode, which results from X-ray diffraction (XRD) omega 2theta ($\omega 2\theta$) scan, is in the range of ±1% with regard to the diffraction angle of a peak of the second conductive semiconductor layer, which results from XRD $\omega 2\theta$ scan, and the FWHM of a main peak of the ZnO transparent electrode, which results from XRD omega ($\omega$) scan, is equal to or less than 900 arc sec.

26 Claims, 13 Drawing Sheets

(51) Int. Cl.
*H01L 33/10* (2010.01)
*H01L 33/32* (2010.01)
*H01L 33/62* (2010.01)
*H01L 33/38* (2010.01)
*C30B 29/16* (2006.01)
*H01L 33/00* (2010.01)
*C30B 7/00* (2006.01)

(52) U.S. Cl.
CPC ............ *H01L 33/325* (2013.01); *H01L 33/62* (2013.01); *C30B 7/005* (2013.01); *C30B 29/16* (2013.01); *H01L 33/007* (2013.01); *H01L 33/32* (2013.01); *H01L 33/387* (2013.01); *H01L 2933/0016* (2013.01)

(56) References Cited

U.S. PATENT DOCUMENTS

| | | | |
|---|---|---|---|
| 2008/0210973 A1* | 9/2008 | Chen | H01L 21/0237 257/102 |
| 2010/0263586 A1 | 10/2010 | Richardson et al. | |
| 2011/0148284 A1* | 6/2011 | Nagao | H01L 21/02376 313/498 |
| 2014/0072812 A1* | 3/2014 | Hamada | H01S 5/02296 428/432 |
| 2014/0175452 A1 | 6/2014 | Richardson et al. | |
| 2015/0318446 A1* | 11/2015 | Hu | H01L 33/005 257/76 |
| 2017/0077356 A1* | 3/2017 | Mughal | H01L 33/42 |
| 2018/0138370 A1* | 5/2018 | Shin | H01L 33/20 |

FOREIGN PATENT DOCUMENTS

| | | |
|---|---|---|
| JP | 2012-169323 A | 9/2012 |
| KR | 10-2007-0097619 A | 10/2007 |
| KR | 10-2012-0133873 A | 12/2012 |
| KR | 10-1285475 B1 | 7/2013 |
| WO | WO-2009143229 A1 * | 11/2009 ............ C30B 25/18 |

OTHER PUBLICATIONS

Supplementary European Search Report from related European Patent Application No. EP16842174 dated Feb. 15, 2019 (8 pages).

* cited by examiner

LIGHT-EMITTING ELEMENT HAVING ZNO TRANSPARENT ELECTRODE AND METHOD FOR MANUFACTURING SAME

TECHNICAL FIELD

Exemplary embodiments of the present disclosure relate to a light emitting diode and a method of manufacturing the same, and more particularly, to a light emitting diode including a ZnO transparent electrode and a method of manufacturing the same.

BACKGROUND ART

In a light emitting diode using nitride semiconductors, a p-type semiconductor layer has lower electrical conductivity than an n-type semiconductor layer. As a result, electric current is not effectively spread in the p-type semiconductor layer in the horizontal direction, thereby causing current crowding in a specific region of the semiconductor layer. If current crowding occurs in the semiconductor layer, the light emitting diode can become susceptible to electrostatic discharge and can suffer from current leakage and efficiency drooping.

In general, an indium tin oxide (ITO) layer is used to provide current spreading in a p-type semiconductor layer. Since the ITO layer is optically transmissive and has electrical conductivity, the ITO layer can achieve current spreading over a large area of the p-type semiconductor layer. However, the ITO layer has a limit in thickness increase due to light absorptivity thereof. Accordingly, there is a limit in current spreading using the ITO layer.

To assist in current spreading using a transparent electrode such as an ITO layer, a current blocking layer (CBL) can be formed under the transparent electrode. Generally, when a process of etching an active layer and a p-type semiconductor layer to expose an n-type semiconductor layer (hereinafter, mesa etching process) is performed prior to a CBL forming process, a location at which the CBL will be formed is determined with reference to the exposed n-type semiconductor layer. As such, since the mesa etching process is performed prior to the CBL forming process, the mesa etching process and a process of etching the transparent electrode, such as an ITO layer, are separately performed. These processes require separate masks for patterning, thereby providing process inconvenience and increasing manufacturing costs.

In recent years, there is an attempt to use a ZnO transparent electrode layer instead of an ITO layer. Since the ZnO transparent electrode layer has lower light absorptivity than the ITO layer, the ZnO transparent electrode layer can be formed to a greater thickness than the ITO layer, thereby providing better current spreading efficiency than the ITO layer.

However, a transparent electrode using typical ZnO exhibits poor electrical characteristics and causes increase in forward voltage Vf when applied to a light emitting diode. Moreover, typical ZnO has low production yield and thus is not suitable for mass production of light emitting diodes.

DISCLOSURE

Technical Problem

Exemplary embodiments of the present disclosure provide a light emitting diode including a monocrystalline ZnO transparent electrode, which has good crystallinity and low electrical resistance to provide good current spreading efficiency.

Exemplary embodiments of the present disclosure provide a light emitting diode including a monocrystalline ZnO transparent electrode, which has crystallinity and thickness suitable for improvement in electrical and optical characteristics, and a method of manufacturing the same.

Exemplary embodiments of the present disclosure provide a method of manufacturing a light emitting diode providing good current spreading efficiency even without a current blocking layer.

Exemplary embodiments of the present disclosure provide a method of manufacturing a light emitting diode, which can simplify a manufacturing process and reduce manufacturing costs through reduction in the number of masks.

Exemplary embodiments of the present disclosure provide a light emitting diode that can improve ohmic contact characteristics with respect to a p-type semiconductor layer even with a ZnO transparent electrode layer while improving light extraction efficiency.

Technical Solution

In accordance with one exemplary embodiment of the present disclosure, a light emitting diode includes: a light emitting structure including a first conductivity type semiconductor layer, an active layer disposed on the first conductivity type semiconductor layer, and a second conductivity type semiconductor layer disposed on the active layer; and a ZnO transparent electrode disposed on the second conductivity type semiconductor layer to form ohmic contact with the second conductivity type semiconductor layer and including monocrystalline ZnO, wherein a diffraction angle of a peak of the ZnO transparent electrode obtained by XRD (X-Ray Diffraction) ω2θ (omega 2theta) scanning is in the range of ±1% with respect to a diffraction angle of a peak of the second conductivity type semiconductor layer obtained by XRD ω2θ scanning and a main peak of the ZnO transparent electrode obtained by XRD ω (omega) scanning has a full width at half maximum (FWHM) of 900 arc sec or less.

The diffraction angle of the peak of the ZnO transparent electrode obtained by XRD ω2θ scanning may be in the range of ±0.5% with respect to the diffraction angle of the peak of the second conductivity type semiconductor layer obtained by XRD ω2θ scanning.

The main peak of the ZnO transparent electrode obtained by XRD ω (omega) scanning may have an FWHM of 870 arc sec or less.

The ZnO transparent electrode may have a thickness of 800 nm or more.

The ZnO transparent electrode may include a ZnO seed layer and a ZnO bulk layer disposed on the ZnO seed layer, and the ZnO bulk layer may have a greater thickness than the ZnO seed layer.

The thickness of the ZnO bulk layer may be 90% to less than 100% of the thickness of the ZnO transparent electrode.

The ZnO seed layer may include undoped ZnO and the ZnO bulk layer may include monocrystalline ZnO doped with at least one of silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), or palladium (Pd).

The ZnO transparent electrode may include a plurality of voids.

The second conductivity type semiconductor layer may have a c-plane as a growth plane and the monocrystalline ZnO of the ZnO transparent electrode may have a wurtzite crystal structure.

In accordance with another exemplary embodiment of the present disclosure, a method of manufacturing a light emitting diode includes: forming a light emitting structure, the light emitting structure including a first conductivity type semiconductor layer, an active layer disposed on the first conductivity type semiconductor layer, and a second conductivity type semiconductor layer disposed on the active layer; and forming a ZnO transparent electrode on the second conductivity type semiconductor layer to form ohmic contact with the second conductivity type semiconductor layer, wherein a diffraction angle of a peak of the ZnO transparent electrode obtained by XRD (X-Ray Diffraction) ω2θ (omega 2theta) scanning is in the range of ±1% with respect to a diffraction angle of a peak of the second conductivity type semiconductor layer obtained by XRD ω2θ scanning and a main peak of the ZnO transparent electrode obtained by XRD ω (omega) scanning has a full width at half maximum (FWHM) of 900 arc sec or less.

Forming the ZnO transparent electrode may include forming a ZnO seed layer on the second conductivity type semiconductor layer; and forming a ZnO bulk layer on the ZnO seed layer using the ZnO seed layer as a seed.

Forming the ZnO seed layer may include forming a ZnO layer on the second conductivity type semiconductor layer by spin coating; and subjecting the ZnO layer to heat treatment, and the ZnO seed layer may form ohmic contact with the second conductivity type semiconductor layer.

Forming the ZnO bulk layer may include forming monocrystalline ZnO on the ZnO seed layer through hydrothermal synthesis; and subjecting the monocrystalline ZnO to heat treatment.

Forming the ZnO bulk layer may include forming a plurality of voids in the ZnO bulk layer.

The ZnO transparent electrode may be formed to a thickness of 800 nm or more.

In accordance with a further exemplary embodiment of the present disclosure, a method of manufacturing a light emitting diode includes: sequentially forming a first conductivity type semiconductor layer, an active layer, and a second conductivity type semiconductor layer on a substrate such that the first conductivity type semiconductor layer is disposed on the substrate; forming a ZnO transparent electrode including monocrystalline ZnO on the second conductivity type semiconductor layer; forming a mask having an opening partially exposing the ZnO transparent electrode; removing a portion of the ZnO transparent electrode exposed through the opening to expose the second conductivity type semiconductor layer; removing a portion of the second conductivity type semiconductor layer exposed through the opening and the active layer disposed under the exposed portion of the second conductivity type semiconductor layer to expose the first conductivity type semiconductor layer; removing the mask; forming a first electrode in a region of the first conductivity type semiconductor layer exposed by removing the second conductivity type semiconductor layer and the active layer; and forming a second electrode on the ZnO transparent electrode.

The ZnO transparent electrode may have a thickness of 800 nm to 900 nm.

An entire lower surface of the ZnO transparent electrode may adjoin an upper surface of the second conductivity type semiconductor layer.

Removal of the ZnO transparent electrode and removal of the second conductivity type semiconductor layer and the active layer may be performed by the same method.

Forming the ZnO transparent electrode may include forming a ZnO seed layer on the second conductivity type semiconductor layer; and forming a ZnO bulk layer on the ZnO seed layer using the ZnO seed layer as a seed.

Forming the ZnO seed layer may include forming a ZnO layer on the second conductivity type semiconductor layer by spin coating; and subjecting the ZnO layer to heat treatment, and the ZnO seed layer may form ohmic contact with the second conductivity type semiconductor layer.

Forming the ZnO bulk layer may include forming monocrystalline ZnO on the ZnO seed layer through hydrothermal synthesis; and subjecting the monocrystalline ZnO to heat treatment.

The method may further include forming a distributed Bragg reflector on a lower surface of the substrate.

In accordance with yet another exemplary embodiment of the present disclosure, a light emitting diode includes: a substrate; a light emitting structure disposed on the substrate and including an n-type semiconductor layer, a p-type semiconductor layer, and an active layer interposed between the n-type semiconductor layer and the p-type semiconductor layer; an ITO layer forming ohmic contact with the p-type semiconductor layer; a ZnO transparent electrode layer disposed on the p-type semiconductor layer to cover upper and side surfaces of the ITO layer and having an inversely inclined side surface; a distributed Bragg reflector disposed on a lower surface of the substrate so as to face the light emitting structure; an n-electrode disposed on the n-type semiconductor layer, and a p-electrode disposed on the p-type semiconductor layer.

The ITO layer may form ohmic contact with the p-type semiconductor layer, stabilizing the ohmic contact characteristics, and the ZnO layer covers the ITO layer, thereby improving light extraction efficiency.

In some exemplary embodiments, the ZnO transparent electrode layer may have a multilayer structure including a lower ZnO layer and an upper ZnO layer. The upper ZnO layer has a lower index of refraction than the lower ZnO layer. With this structure, the light emitting diode can reduce light loss caused by total internal reflection in the ZnO transparent electrode layer.

The ZnO transparent electrode layer may be deposited on the ITO layer through hydrothermal synthesis and thus have good light transmittance. Furthermore, the ZnO transparent electrode layer may have a film-shaped continuous single crystal structure. The ZnO transparent electrode layer of the continuous single crystal structure may occupy 90% or more of the area of the p-type semiconductor layer.

In accordance with yet another exemplary embodiment of the present disclosure, a method of manufacturing a light emitting diode includes: forming an n-type semiconductor layer, an active layer and a p-type semiconductor layer on a substrate; forming an ITO layer on the p-type semiconductor layer; patterning the ITO layer to allow the ITO layer to remain in some region of the p-type semiconductor layer; forming a ZnO layer to cover the remaining ITO layer; and etching the ZnO layer to allow the ZnO layer to remain in some region of the p-type semiconductor layer. Here, the remaining ZnO layer may cover upper and side surfaces of the remaining ITO layer and may have an inversely inclined side surface.

The method may further include etching the p-type semiconductor layer and the active layer to form a mesa after etching the ZnO layer. Accordingly, the mesa may be formed using the same mask as a mask for etching the ZnO layer.

The ZnO layer may be formed through hydrothermal synthesis. In this case, since the ITO layer is used as a seed layer, it is possible to omit the process of forming the ZnO seed layer. Even without the ZnO seed layer, the ZnO layer may be formed to have a film-shaped continuous single crystal structure instead of a columnar crystal structure. In addition, the ZnO layer may remain to occupy 90% or more of the area of the mesa after etching.

In some exemplary embodiments, forming the ZnO layer may include forming a lower ZnO layer and forming an upper ZnO layer on the lower ZnO layer. The upper ZnO layer has a lower index of refraction than the lower ZnO layer. With this structure, the light emitting diode can reduce light loss caused by total internal reflection.

Advantageous Effects

According to exemplary embodiments, the light emitting diode employs the ZnO transparent electrode, which includes a ZnO seed layer and ae ZnO bulk layer formed by different processes and exhibits good electrical contact characteristics with the second conductivity type semiconductor layer, thereby improving electrical characteristics of the light emitting diode. In addition, the ZnO transparent electrode has a predetermined level or more of crystallinity to improve production yield of the ZnO transparent electrode and thus can be easily applied to mass production of light emitting diodes.

According to exemplary embodiments, the ZnO transparent electrode can secure sufficient current spreading in the light emitting diode, thereby enabling omission of a current blocking layer and improvement in resistance with respect to electrostatic discharge (ESD) while simplifying a manufacturing process. Further, the process of partially removing the second conductivity type semiconductor layer and the active layer to expose a portion of the first conductivity type semiconductor layer and the process of partially removing the ZnO transparent electrode in a predetermined pattern can be performed using the same mask. As a result, it is possible to simplify the manufacturing process while reducing manufacturing costs.

According to some exemplary embodiments, the light emitting diode employs both an ITO layer and a ZnO layer, thereby improving ohmic contact characteristics. Furthermore, the ZnO layer is formed to cover upper and side surfaces of the ITO layer, thereby improving light extraction efficiency.

BEST MODE

Figure 1:
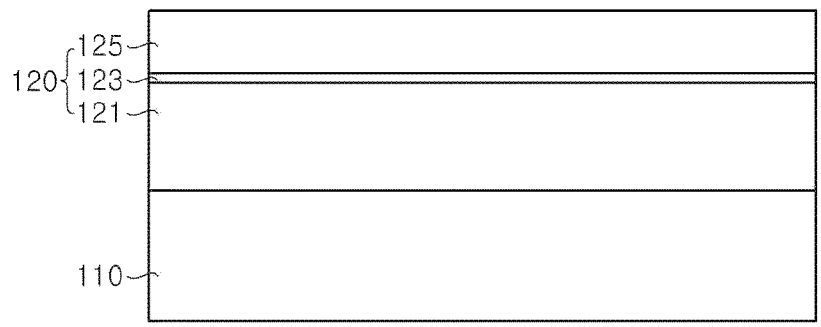
FIG. 1 to FIG. 3 are sectional views illustrating a light emitting diode according to one exemplary embodiment of the present disclosure and a method of manufacturing the same.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

It should be understood that respective composition ratios, growth methods, growth conditions, and thicknesses of semiconductor layers described below are provided for illustration only and do not limit the scope of the present disclosure. For example, when a certain semiconductor layer is represented by AlGaN, the composition ratio of Al and Ga in the semiconductor layer may be determined in various ways, as needed. Furthermore, semiconductor layers described below may be grown by various methods generally known to a person having ordinary knowledge in the art (hereinafter, "those skilled in the art"), for example, metal organic chemical vapor deposition (MOCVD), molecular beam epitaxy (MBE), hydride vapor phase epitaxy (HVPE), and the like. In the following exemplary embodiments, semiconductor layers will be described as being grown in the same chamber by MOCVD. During growth of the semiconductor layers, sources introduced into the chamber may be selected from sources known to those skilled in the art, for example, TMGa, TEGa and the like as Ga sources, TMAl, TEAl and the like as Al sources, TMIn, TEIn, and the like as In sources, and $NH_3$ as a N sources, without being limited thereto.

Furthermore, in the following exemplary embodiments, a material referred to as monocrystalline ZnO may include ZnO having a predetermined crystal structure and may include, for example, ZnO having the wurtzite crystal structure. In addition, the monocrystalline ZnO may be a single crystal including a thermodynamic intrinsic defect and may also be a single crystal including a trace of defects that can occur in a manufacturing process, such as void defects, dislocations, grain boundaries, and the like. Further, the monocrystalline ZnO may be a single crystal containing a trace of impurities or dopants. That is, monocrystalline ZnO containing unintentional or unavoidable defects or impurities may be included in the monocrystalline ZnO referred to herein.

Figure 2:
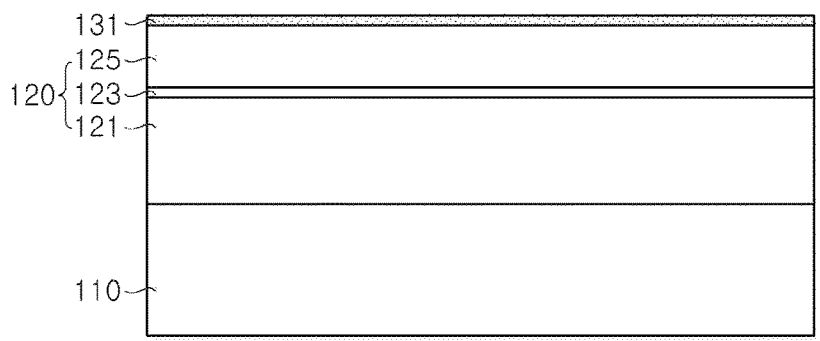
Figure 3:
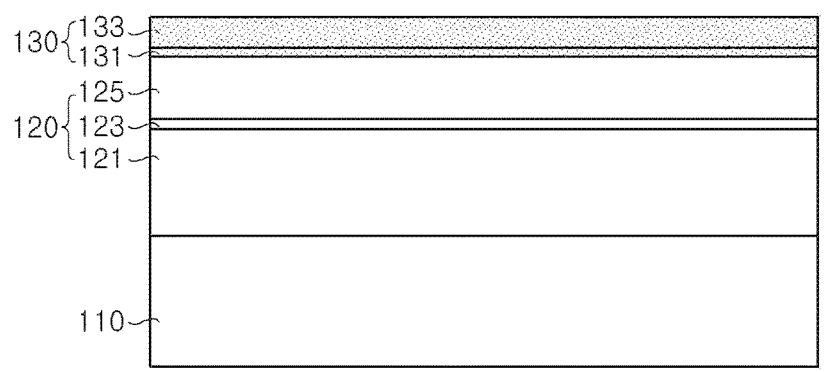

FIG. 1 to FIG. 3 are sectional views illustrating a light emitting diode according to one exemplary embodiment of the present disclosure and a method of manufacturing the same. Particularly, in description of the light emitting diode and a ZnO transparent electrode 130 with reference to FIG. 1 to FIG. 3, the ZnO transparent electrode 130 will be described in more detail with reference to FIG. 4 to FIG. 6.

Referring to FIG. 1, a light emitting structure 120 is formed. The light emitting structure 120 may be formed on a substrate 110.

The substrate 110 may be an insulating or conductive substrate. In addition, the substrate 110 may be a growth substrate for growing the light emitting structure 120 thereon, and may include a sapphire substrate, a silicon carbide substrate, a silicon substrate, a gallium nitride substrate, an aluminum nitride substrate, or the like. Alternatively, the substrate 110 may be a secondary substrate for supporting the light emitting structure 120. For example, the substrate 110 may be a patterned sapphire substrate (PSS) having a predetermined pattern on an upper surface thereof.

The light emitting structure 120 may include a first conductivity type semiconductor layer 121, a second conductivity type semiconductor layer 125 disposed on the first conductivity type semiconductor layer 121, and an active layer 123 interposed between the first conductivity type semiconductor layer 121 and the second conductivity type semiconductor layer 125.

The first conductivity type semiconductor layer 121, the active layer 123 and the second conductivity type semiconductor layer 125 may include Group III-V based nitride semiconductors, for example, nitride semiconductors such as (Al, Ga, In)N. Each of the first conductivity type semiconductor layer 121, the active layer 123 and the second conductivity type semiconductor layer 125 may be formed in a chamber by a growth method well-known to those skilled in the art, such as MOCVD. The first conductivity type semiconductor layer 121 may include n-type dopants (for example, Si, Ge, Sn) and the second conductivity type semiconductor layer 125 may include p-type dopants (for example, Mg, Sr, Ba), or vice versa. For example, the first conductivity type semiconductor layer 121 may include GaN including Si dopants and the second conductivity type semiconductor layer may include GaN including Mg dopants. The active layer 123 may include a multiple quantum well (MQW) structure and the composition ratio of the nitride semiconductor thereof may be adjusted to emit light having a desired wavelength.

The semiconductor layers 121, 123, 125 of the light emitting structure 120 may have a certain growth plane. The growth plane of the semiconductor layers 121, 123, 125 of the light emitting structure 120 corresponds to a growth plane of the substrate 110. For example, when the substrate 110 has the c-plane ((0001)) as the growth plane, the semiconductor layers 121, 123, 125 of the light emitting structure 120 also have the c-plane as the growth plane. In this case, an upper surface of the second conductivity type semiconductor layer 125 has the c-plane, without being limited thereto. Alternatively, the light emitting structure 120 may have a non-polar or semi-polar growth plane and may have a growth plane tilted at an offset angle with respect to a specific crystal plane.

The light emitting structure 120 may be modified into various shapes depending upon the structure of the light emitting diode. The light emitting diode according to this exemplary embodiment may be changed or modified into light emitting diodes of various structures, such as a lateral type light emitting diode, a vertical type light emitting diode, and a flip-chip type light emitting diode. Although the light emitting diodes of the various structures will be described below in detail, it should be understood that other implementations are possible.

Referring to FIG. 2 and FIG. 3, the ZnO transparent electrode 130 is formed on the light emitting structure 120. The process of forming the ZnO transparent electrode 130 may include forming a ZnO seed layer 131 and forming a ZnO bulk layer 133 on the ZnO seed layer 131. The ZnO bulk layer 133 may be grown on the ZnO seed layer 131 used as a seed.

Specifically, referring to FIG. 2, the ZnO seed layer 131 is formed on the light emitting structure 120. The ZnO seed layer 131 is formed on the second conductivity type semiconductor layer 125. The ZnO seed layer 131 may form ohmic contact with the second conductivity type semiconductor layer 125.

The ZnO seed layer 131 may be formed on the second conductivity type semiconductor layer 125 by various methods. For example, the ZnO seed layer 131 may be formed on the second conductivity type semiconductor layer 125 by spin coating. The process of forming the ZnO seed layer 131 may include spin coating a solution containing ZnO particles or Zn onto the light emitting structure 120. The process of forming the ZnO seed layer 131 may further include subjecting the ZnO layer formed by spin coating to heat treatment. Heat treatment of the ZnO layer may be performed at about 450° C. to 550° C. under a nitrogen atmosphere. By heat treatment, the ZnO seed layer 131 can form ohmic contact with the second conductivity type semiconductor layer 125.

For example, a solution, which contains zinc acetate dehydrate as an initiation material, methoxyethanol as a solvent, and monoethanolamine as a stabilizer, is prepared. Then, the solution is applied on the second conductivity type semiconductor layer 125 by spin coating. The ZnO seed layer 131 is formed by drying the solution at about 300° C.

for about 10 minutes to remove the solvent and organic residues. Then, the ZnO seed layer 131 may be subjected to heat treatment at about 500° C.

Alternatively, the ZnO seed layer 131 may be formed by hydrothermal synthesis, sol-gel synthesis, vacuum deposition such as atomic layer deposition (ALD), pulsed laser deposition (PLD), molecular beam epitaxy (MBE), metal organic chemical vapor deposition (MOCVD), and RF-sputtering, electrochemical deposition, dip coating, and the like.

The ZnO seed layer 131 may include a single crystal structure that has a similar crystal structure to the crystal structure of the light emitting structure 120. The monocrystalline ZnO may have the wurtzite structure which has a similar lattice parameter to that of a nitride semiconductor, for example, GaN. Accordingly, the monocrystalline ZnO may have a single crystal structure having the same orientation as the nitride semiconductor. For example, when the growth plane of the second conductivity type semiconductor layer 125 is the c-pane ((0001)), the ZnO seed layer 131 may also have a crystal structure having an orientation corresponding to the (0001) plane. Thus, the ZnO transparent electrode 130 including the ZnO seed layer 131 has good adhesion with respect to the second conductivity type semiconductor layer 125, thereby preventing deterioration in electrical characteristics and luminous intensity caused by peeling of the transparent electrode while improving reliability of the light emitting diode. Furthermore, the ZnO seed layer 131 may be formed of undoped monocrystalline ZnO. The ZnO seed layer 131 formed of the undoped monocrystalline ZnO can exhibit good crystallinity.

The ZnO seed layer 131 can act as a seed for growth of the ZnO bulk layer 133 described below and can also act to form ohmic contact with the second conductivity type semiconductor layer 125. Particularly, the ZnO seed layer 131 may be formed of undoped ZnO to improve crystallinity of the ZnO bulk layer 133 formed by the subsequent process. The ZnO seed layer 131 may have a thinner thickness than the ZnO bulk layer 133 and may have a thickness of, for example, several to dozens of nanometers.

Next, referring to FIG. 3, the ZnO bulk layer 133 is formed on the ZnO seed layer 131, thereby forming the ZnO transparent electrode 130. As a result, a light emitting diode including the light emitting structure 120 and the ZnO transparent electrode 130 disposed on the light emitting structure 120 is provided.

The ZnO bulk layer 133 may be formed on the second conductivity type semiconductor layer 125 through various methods. For example, the ZnO bulk layer 133 may be formed on the second conductivity type semiconductor layer 125 through hydrothermal synthesis. The process of forming the ZnO bulk layer 133 may include forming a monocrystalline ZnO layer on the light emitting structure 120 through hydrothermal synthesis using a solution containing a ZnO precursor. Here, the monocrystalline ZnO layer may be grown from the ZnO seed layer 131. In addition, the process of forming the ZnO bulk layer 133 may further include subjecting the monocrystalline ZnO layer formed through hydrothermal synthesis to heat treatment. Heat treatment of the ZnO layer may be performed at about 200° C. to about 300° C. under a nitrogen atmosphere. By heat treatment, the ZnO bulk layer 133 can have reduced sheet resistance and improved light transmittance (reduction in absorptivity).

A solution for forming the monocrystalline ZnO layer is prepared. The solution is prepared by dissolving a zinc salt and a precipitant in a polar solvent. The zinc salt acts as a donor of zinc ions ($Zn^{2+}$) and the precipitant acts as a donor of a hydroxy group (OH—). The zinc salt may include at least one of zinc acetate, zinc nitrate, zinc sulfate, and zinc chloride. The precipitant may include at least one of NaOH, $Na_2CO_3$, LiOH, $H_2O_2$, KOH, HMTA (hexamethylenetetramine), and $NH_4OH$. The polar solvent may include at least one of water, alcohol, and an organic solvent.

The monocrystalline ZnO layer is formed by applying the solution onto the ZnO seed layer 131, followed by heat treatment. Heat treatment may be performed at 50° C. to 100° C. under normal pressure. As a result, the zinc salt reacts with the precipitant to form monocrystalline ZnO thereby forming the ZnO bulk layer 133.

The method of forming the ZnO bulk layer 133 is not limited thereto. The ZnO bulk layer 133 may be formed by any methods capable of forming the ZnO bulk layer 133 so as to have substantially the same crystallinity as the ZnO seed layer 131. For example, the ZnO bulk layer 133 may be formed by sol-gel synthesis, vacuum deposition such as atomic layer deposition (ALD), pulsed laser deposition (PLD), molecular beam epitaxy (MBE), metal organic chemical vapor deposition (MOCVD), and RF-sputtering, electrochemical deposition, dip coating, spin coating, and the like.

The ZnO transparent electrode 130 including such monocrystalline ZnO or the ZnO bulk layer 133 formed of the monocrystalline ZnO can exhibit relatively good crystallinity. Particularly, according to exemplary embodiments of the present disclosure, the main peak of the ZnO transparent electrode 130 obtained upon XRD ω scanning may have a full width at half maximum (FWHM) of about 900 arc sec or less, specifically about 870 arc sec or less.

In addition, since the ZnO bulk layer 133 is grown from the ZnO seed layer 131, the ZnO bulk layer 133 may include a single crystal structure having substantially the same crystal structure as the ZnO seed layer 131. Accordingly, the ZnO bulk layer 133 may have a single crystal structure having a similar crystal structure to the crystal structure of the light emitting structure 120, and the ZnO transparent electrode 130 may have a similar crystal structure to the crystal structure of the light emitting structure 120. The monocrystalline ZnO may have the wurtzite structure which has a similar lattice parameter to that of a nitride semiconductor, for example, GaN. Accordingly, the monocrystalline ZnO may have a single crystal structure having the same orientation as the nitride semiconductor. For example, when the growth plane of the second conductivity type semiconductor layer 125 is the c-pane ((0001)), the ZnO seed layer 131 may also have a crystal structure having an orientation corresponding to the (0001) plane and the ZnO bulk layer 133 grown from the ZnO seed layer 131 may also have a crystal structure having an orientation corresponding to the (0001) plane. Thus, the ZnO transparent electrode 130 may include monocrystalline ZnO having a crystal structure having an orientation corresponding to the (0001) plane. It should be understood that other implementations are possible. Alternatively, when the second conductivity type semiconductor layer 125 has a non-polar or semi-polar growth plane, the ZnO transparent electrode 130 may have a crystal structure having an orientation corresponding to the growth plane.

That is, since the second conductivity type semiconductor layer 125 and the ZnO transparent electrode 130 have substantially the same crystal structure and substantially the same crystal orientation, a diffraction angle of a ZnO peak obtained upon XRD ω2θ scanning with respect to the ZnO seed layer 131 and the ZnO transparent electrode 130 including the ZnO bulk layer 133 may be substantially identical to a diffraction angle of a peak obtained upon XRD ω2θ scanning with respect to the second conductivity type semiconductor layer 125. For example, the diffraction angle of the ZnO peak obtained upon XRD ω2θ scanning may be in the range of about ±1%, specifically in the range of about ±0.5%, with respect to the diffraction angle of the nitride semiconductor peak obtained upon XRD ω2θ scanning.

Since the ZnO transparent electrode 130 has the same orientation and the same crystal structure as those of GaN, the ZnO transparent electrodes 130 applied to different light emitting diodes may have substantially the same orientation and the same crystal structure even when the ZnO transparent electrodes 130 are applied to a plurality of light emitting diodes. Accordingly, deviation in characteristics between the ZnO transparent electrodes 130 applied to the plurality of light emitting diodes can be reduced, thereby improving production yield.

In addition, the ZnO bulk layer 133 may further include a dopant. Thus, the ZnO bulk layer 133 may include doped monocrystalline ZnO. The ZnO bulk layer 133 may include a metallic dopant. For example, the ZnO bulk layer 133 may include at least one of silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), or palladium (Pd). In this exemplary embodiment, the ZnO bulk layer 133 may be formed of Ga-doped ZnO (GZO). The ZnO bulk layer 133 containing a metallic dopant can further reduce sheet resistance, thereby enabling more uniform current spreading in the horizontal direction. Alternatively, the ZnO bulk layer 133 may be formed of undoped ZnO.

The ZnO bulk layer 133 may have a greater thickness than the ZnO seed layer 131 and may have a thickness of, for example, several hundred nanometers. In addition, the thickness of the ZnO bulk layer 133 may be about 90% to less than 100% of the total thickness of the ZnO transparent electrode 130. As such, since the ZnO bulk layer 133 having a predetermined level or more of crystallinity is formed to a thickness about 90% or more of the total thickness of the ZnO transparent electrode 130, the ZnO transparent electrodes 130 applied to a plurality of light emitting diodes can exhibit substantially similar or the same characteristics. Accordingly, deviation in characteristics between the ZnO transparent electrodes 130 can be reduced, thereby improving production yield.

Furthermore, the ZnO transparent electrode 130 may have a total thickness of about 800 nm or more. With the structure wherein the total thickness of the ZnO transparent electrode 130 is about 800 nm or more, it is possible to substantially reduce stress and strain caused by lattice mismatch of the ZnO transparent electrode 130. In addition, with the structure wherein the ZnO transparent electrode 130 has a total thickness of about 800 nm or more, it is possible to improve crystallinity of the ZnO transparent electrode 130. Furthermore, since the monocrystalline ZnO has good light transmittance, the monocrystalline ZnO can be formed to a relatively thick thickness. The monocrystalline ZnO may be formed to a thickness of several hundred nanometers or more, and even when the monocrystalline ZnO is formed to a thickness of several micrometers, the monocrystalline ZnO does not suffer from significant increase in light absorptivity, thereby improving light extraction efficiency of the light emitting diode. That is, with a total thickness of about 800 nm or more, the ZnO transparent electrode 130 can have improved crystallinity while improving current spreading efficiency therein. Accordingly, the light emitting diode according to this exemplary embodiment has low forward voltage (Vf) and high luminous efficacy.

The ZnO bulk layer 133 may include a plurality of voids. The voids may be randomly dispersed in the ZnO bulk layer 133. The voids may have a diameter of several to dozens of nanometers. The voids in the ZnO bulk layer 133 may be formed during formation of the ZnO bulk layer 133. For example, $H_2O$ or $OH^-$ present in the ZnO bulk layer 133 is evaporated by heat supplied for hydrothermal synthesis or heat treatment of the ZnO bulk layer 133 so that voids can be generated in the ZnO bulk layer 133. The voids can scatter light passing through the ZnO transparent electrode 130, thereby improving light extraction efficiency of the light emitting diode.

In this way, the ZnO transparent electrode 130 is formed in the multilayer structure including the ZnO seed layer 131 and the ZnO bulk layer 133, thereby facilitating formation of ohmic contact between the ZnO transparent electrode 130 and the second conductivity type semiconductor layer 125, improving crystallinity of the ZnO transparent electrode 130, and enabling formation of the ZnO transparent electrode 130 having low sheet resistance and high light transmittance. As a result, it is possible to improve electrical and optical characteristic of the light emitting diode. In addition, as in the above exemplary embodiment, the ZnO transparent electrode 130 is formed by forming the ZnO seed layer 131 through spin coating, followed by forming the ZnO bulk layer 133 on the ZnO seed layer 131 through hydrothermal synthesis, thereby securing good electrical contact with second conductivity type semiconductor layer 125. Accordingly, forward voltage (Vf) of the light emitting diode according to the exemplary embodiments can be reduced. Furthermore, the ZnO transparent electrode 130 formed by the methods according to the exemplary embodiments can have a predetermined level or more of crystallinity, thereby reducing deviation in characteristics between plural light emitting diodes when applied to fabrication of the plural light emitting diodes. Accordingly, production yield of light emitting diodes each including the ZnO transparent electrode 130 can be improved and the ZnO transparent electrode 130 according to the exemplary embodiments can be easily applied to mass production of light emitting diodes.

The ZnO transparent electrode 130 of the light emitting diode according to the exemplary embodiment will be described in more detail with reference to FIG. 4 and FIG. 5. The light emitting diode according to this exemplary embodiment includes the light emitting structure 120 and the ZnO transparent electrode 130 disposed on a sapphire substrate, in which the ZnO transparent electrode 130 includes the ZnO seed layer 131 and the ZnO bulk layer 133. In the light emitting structure 120, the second conductivity type semiconductor layer 125 includes P—GaN and the growth plane of the second conductivity type semiconductor layer 125 is the c-plane. The ZnO transparent electrode 130 may have a thickness of about 800 nm.

Figure 4:
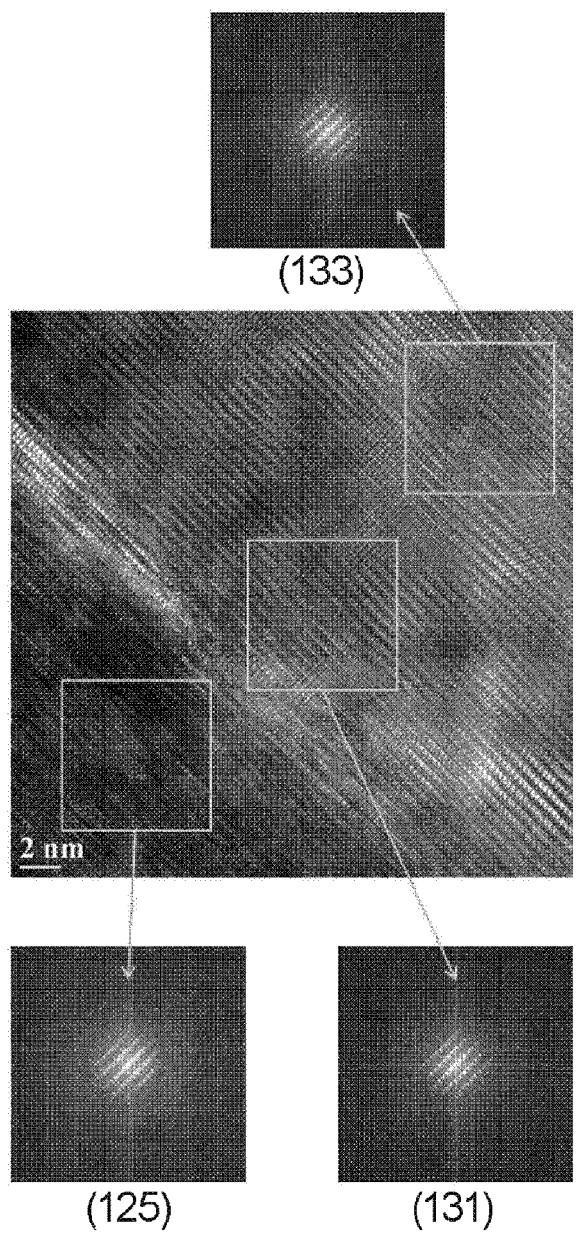
FIG. 4 shows transmission electron micrographs (TEM) of an XRD (X-ray Diffraction) pattern with respect to a ZnO transparent electrode of a light emitting diode according to one exemplary embodiment of the present disclosure.

FIG. 4 shows transmission electron micrographs (TEM) of an XRD (X-ray Diffraction) pattern with respect to the ZnO transparent electrode of the light emitting diode according to the exemplary embodiment of the present disclosure. The TEM images of FIG. 4 show a portion of the ZnO transparent electrode 130 formed on the second conductivity type semiconductor layer 125 formed of P—GaN. As can be seen from the XRD patterns of FIG. 4, all of the second conductivity type semiconductor layer 125 formed of P—GaN, the ZnO seed layer 131 and the ZnO bulk layer 133 have a single crystal structure.

Figure 5:
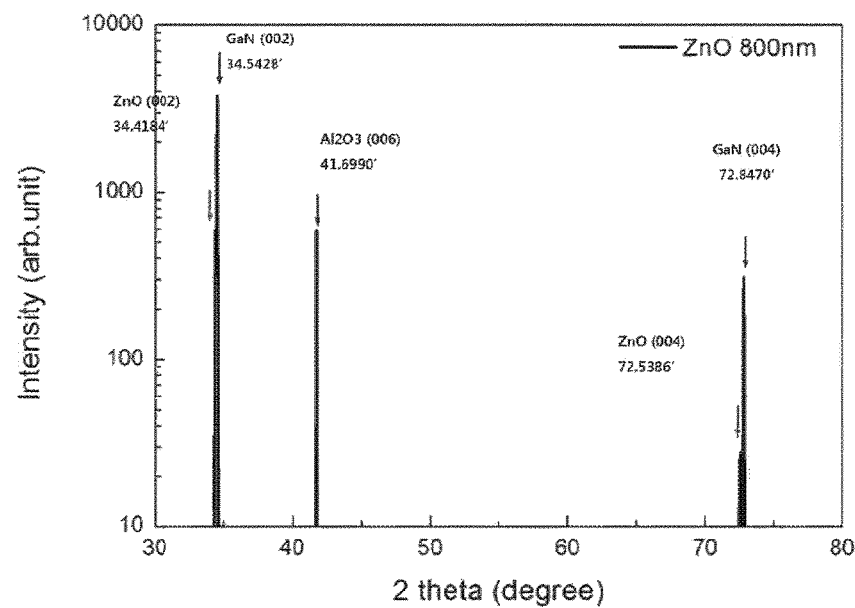
FIG. 5 is a graph depicting XRD (X-ray Diffraction) values with respect to the ZnO transparent electrode and nitride layers in the light emitting diode according to the exemplary embodiment of the present disclosure by XRD scanning.

FIG. 5 is a graph depicting XRD values with respect to the ZnO transparent electrode and the nitride layers in the light emitting diode according to the exemplary embodiment of the present disclosure by XRD ω2θ scanning. Referring to FIG. 5, it can be seen that the diffraction angle of the peak of P—GaN (second conductivity type semiconductor layer 125) having a crystal orientation corresponding to the normal direction of a (004) plane is substantially identical to the diffraction angle of the peak of ZnO (ZnO transparent electrode 130) having a crystal orientation corresponding to the normal direction of the (004) plane. In this case, the diffraction angle of the peak of ZnO (ZnO transparent electrode 130) has a small deviation of about 4.26% with respect to the diffraction angle of the peak of P—GaN (second conductivity type semiconductor layer 125). In addition, it can be seen that the diffraction angle of the peak of P—GaN (second conductivity type semiconductor layer 125) having a crystal orientation corresponding to the normal direction of a (002) plane is substantially identical to the diffraction angle of the peak of ZnO (ZnO transparent electrode 130) having a crystal orientation corresponding to the normal direction of the (002) plane. In this case, the diffraction angle of the peak of ZnO (ZnO transparent electrode 130) has a small deviation of about 3.76% with respect to the diffraction angle of the peak of P—GaN (second conductivity type semiconductor layer 125).

Figure 6:
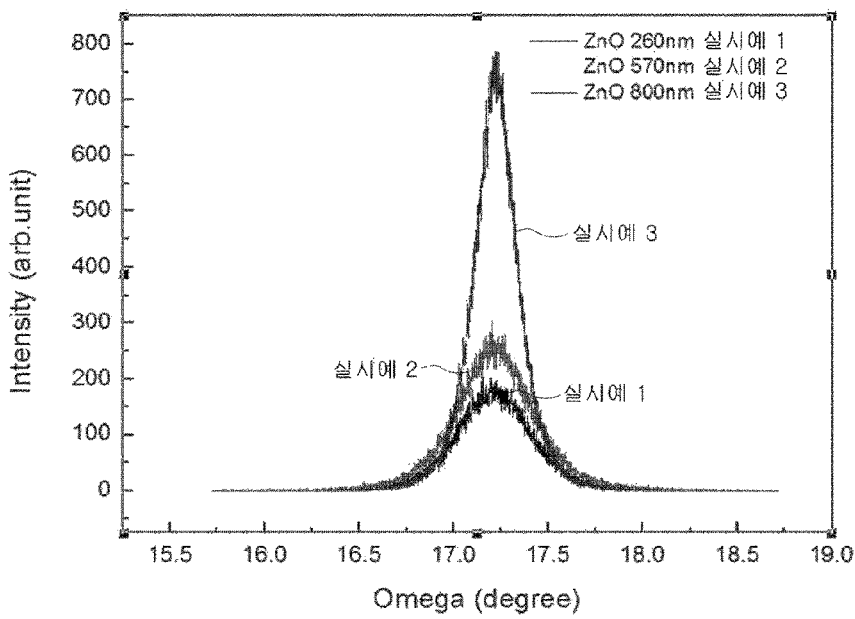
FIG. 6 is a graph depicting XRD (X-ray Diffraction) values with respect to a ZnO transparent electrode and nitride layers in each of light emitting diodes according to exemplary embodiments of the present disclosure by XRD scanning.

FIG. 6 is a graph depicting XRD values with respect to a ZnO transparent electrode and nitride layers in each of light emitting diodes according to exemplary embodiments of the present disclosure by XRD ω scanning. Each of the light emitting diodes fabricated in Examples 1 to 3 includes a light emitting structure 120 and a ZnO transparent electrode 130 disposed on a sapphire substrate, in which the ZnO transparent electrode 130 includes a ZnO seed layer 131 and a ZnO bulk layer 133. The second conductivity type semiconductor layer 125 of the light emitting structure 120 includes P—GaN and the growth plane of the second conductivity type semiconductor layer 125 is the c-plane. In Examples 1 to 3, the ZnO transparent electrodes 130 have thicknesses of 260 nm, 570 nm and 800 nm, respectively.

Referring to FIG. 6, as obtained by XRD ω scanning, the main peaks of the ZnO transparent electrode 130 of Example 1 may have a full width at half maximum of about 1,436 arc sec, the main peaks of the ZnO transparent electrode 130 of Example 2 may have a full width at half maximum of about 1,428 arc sec, and the main peaks of the ZnO transparent electrode 130 of Example 3 may have a full width at half maximum of about 869 arc sec. This result shows that, even when the thickness of the ZnO transparent electrode 130 increases from 260 nm to 570 nm, the full width at half maximum of the main peaks obtained by XRD ω scanning does not significantly decrease and crystallinity of the ZnO transparent electrode 130 does not significantly vary. On the contrary, when the thickness of the ZnO transparent electrode 130 increases from 570 nm to 800 nm, the full width at half maximum of the main peaks obtained by XRD ω scanning rapidly decreases. That is, this result shows that crystallinity of the ZnO transparent electrode 130 significantly increases. Accordingly, when the ZnO transparent electrode 130 has a thickness of about 800 nm or more, lattice mismatch of the monocrystalline ZnO is significantly decreased, thereby providing significant improvement in crystallinity through reduction in stress and strain caused by lattice mismatch.

Figure 7:
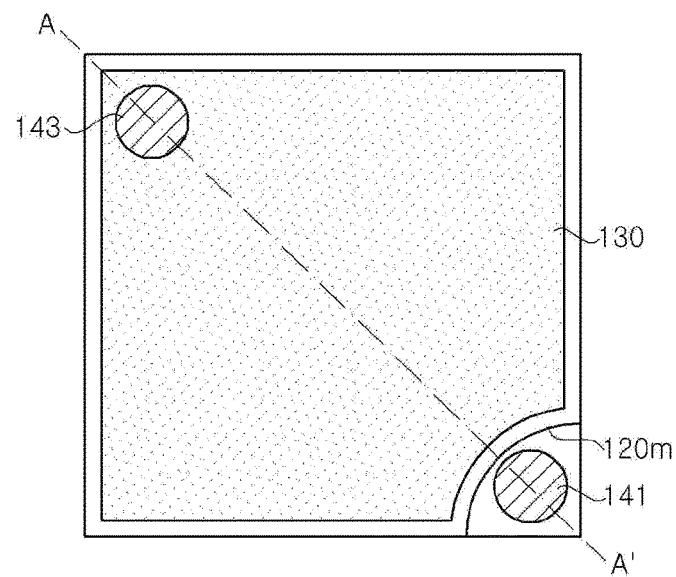
FIG. 7 and FIG. 8 are a plan view and a cross-sectional view of a light emitting diode according to other exemplary embodiments of the present disclosure, respectively.
Figure 8:
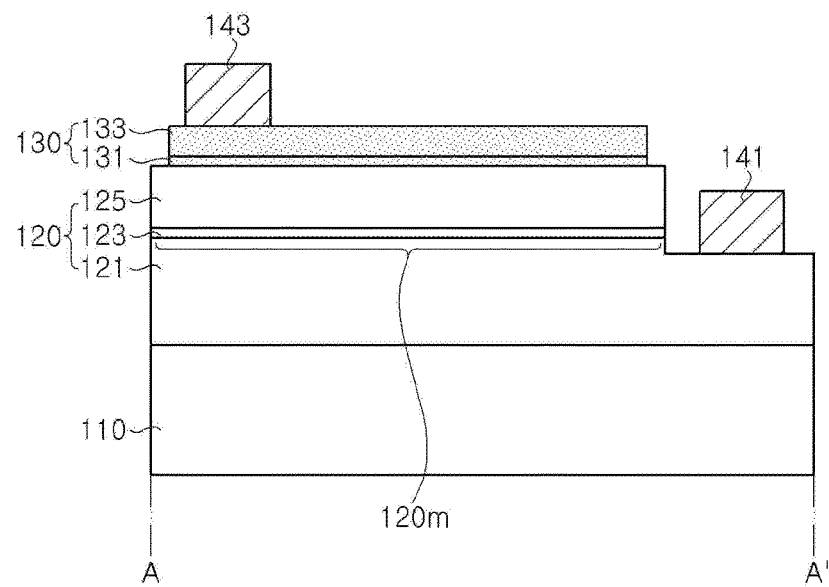

FIG. 7 and FIG. 8 are a plan view and a cross-sectional view of a light emitting diode according to other exemplary embodiments of the present disclosure, respectively. FIG. 8 is a cross-sectional view taken along line A-A' of FIG. 7. Detailed description of the same components as those of the above exemplary embodiments will be omitted.

Referring to FIG. 7 and FIG. 8, the light emitting diode includes a light emitting structure 120 and a ZnO transparent electrode 130. Further, the light emitting diode may include a substrate 110 under the light emitting structure 120, a first electrode 141, and a second electrode 143. The light emitting diode according to this exemplary embodiment is provided as one example of a lateral type light emitting diode and the ZnO transparent electrode 130 can be applied to the lateral type light emitting diode as in this exemplary embodiment.

The light emitting structure 120 according to this exemplary embodiment may be generally similar to the light emitting structure of the above exemplary embodiments. In this exemplary embodiment, the light emitting structure 120 may include a mesa 120m, which includes a second conductivity type semiconductor layer 125 and an active layer 123. Further, a first conductivity type semiconductor layer 121 may be partially exposed in some regions around the mesa 120m.

The ZnO transparent electrode 130 may be disposed on the mesa 120m and may cover substantially the entire upper surface of the mesa 120m. In addition, the ZnO transparent electrode 130 may include a ZnO seed layer 131 and a ZnO bulk layer 133. The ZnO seed layer 131 may form ohmic contact with the second conductivity type semiconductor layer 125.

The first electrode 141 and the second electrode 143 may be electrically connected to the first conductivity type semiconductor layer 121 and the second conductivity type semiconductor layer 125, respectively. For example, the first electrode 141 may be disposed in an exposed region of the first conductivity type semiconductor layer 121 around the mesa 120m to be electrically connected to the first conductivity type semiconductor layer 121. The second electrode 143 may be disposed on the ZnO transparent electrode 130 to be electrically connected to the second conductivity type semiconductor layer 125 through the ZnO transparent electrode 130. Electric current supplied to the light emitting diode through the second electrode 143 can be spread in the horizontal direction in the ZnO transparent electrode 130, thereby improving current spreading efficiency and luminous efficacy of the light emitting diode. The locations of the first electrode 141 and the second electrode 143 can be changed in various ways by taking into account the flow and distribution of electric current, instead of being limited to certain locations. For example, as shown in FIG. 7 and FIG. 8, the first electrode 141 may be disposed near one corner of the light emitting diode and the second electrode 143 may be disposed near the other corner of the light emitting diode so as to face the first electrode 141. In addition, each of the first electrode 141 and the second electrode 143 may include an electrode pad electrically connected to an external power source via a wire and an extended portion (not shown).

Since a light emitting surface of a lateral type light emitting diode is generally an upper surface of the light emitting diode, light emitted from the active layer 123 can be discharged through the ZnO transparent electrode 130. According to the exemplary embodiments, the ZnO transparent electrode 130 has high light transmittance, thereby improving luminous efficacy of the light emitting diode.

Figure 9:
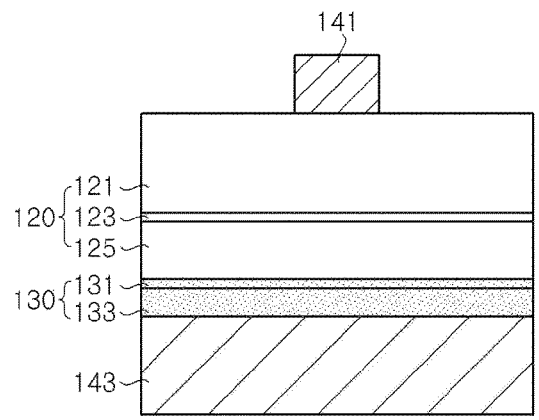
FIG. 9 is a cross-sectional view of a light emitting diode according to other exemplary embodiments of the present disclosure.

FIG. 9 is a cross-sectional view of a light emitting diode according to other exemplary embodiments of the present disclosure. Detailed description of the same components as those of the above exemplary embodiments will be omitted.

Referring to FIG. 9, the light emitting diode includes a light emitting structure 120 and a ZnO transparent electrode 130. Further, the light emitting diode may include a first electrode 141 and a second electrode 143. The light emitting diode according to this exemplary embodiment is provided as one example of a vertical type light emitting diode and the ZnO transparent electrode 130 can be applied to the vertical type light emitting diode as in this exemplary embodiment.

The light emitting structure 120 according to this exemplary embodiment may be generally similar to the light emitting structure of the above exemplary embodiments. In this exemplary embodiment, the active layer 123 may be disposed on the second conductivity type semiconductor layer 125 and the first conductivity type semiconductor layer 121 may be disposed on the active layer 123. The ZnO transparent electrode 130 may be disposed under the second conductivity type semiconductor layer 125 to cover substantially the entire lower surface of the second conductivity type semiconductor layer 125. In addition, the ZnO transparent electrode 130 may include a ZnO seed layer 131 and a ZnO bulk layer 133. The ZnO seed layer 131 may form ohmic contact with the second conductivity type semiconductor layer 125.

The first electrode 141 and the second electrode 143 may be electrically connected to the first conductivity type semiconductor layer 121 and the second conductivity type semiconductor layer 125, respectively. For example, the first electrode 141 may be disposed on the light emitting structure 120 to be electrically connected to the first conductivity type semiconductor layer 121.

The second electrode 143 may be disposed under the ZnO transparent electrode 130 to be electrically connected to the second conductivity type semiconductor layer 125 through the ZnO transparent electrode 130. Electric current supplied to the light emitting diode through the second electrode 143 can be spread in the horizontal direction in the ZnO transparent electrode 130, thereby improving current spreading efficiency and luminous efficacy of the light emitting diode.

In the light emitting diode according to this exemplary embodiment, the second electrode 143 may act as a support substrate for supporting the light emitting structure 120. In addition, the second electrode 143 may include a reflective layer (not shown), which can reflect light emitted from the active layer 123 in an upward direction. For example, the second electrode 143 may include a support substrate (not shown), a reflective layer (not shown) disposed on the support substrate and electrically contacting the ZnO transparent electrode 130, and a bonding layer (not shown), which bonds the support substrate to the reflective layer.

Since the vertical type light emitting diode generally has a flow of electric current through a passage between electrodes disposed at upper and lower portions thereof, current crowding is likely to occur around the first electrode 141 disposed on the first conductivity type semiconductor layer 121. According to this exemplary embodiment, electric current can be spread through the ZnO transparent electrode 130 under the light emitting structure 120, thereby improving luminous efficacy of the light emitting diode.

Figure 10:
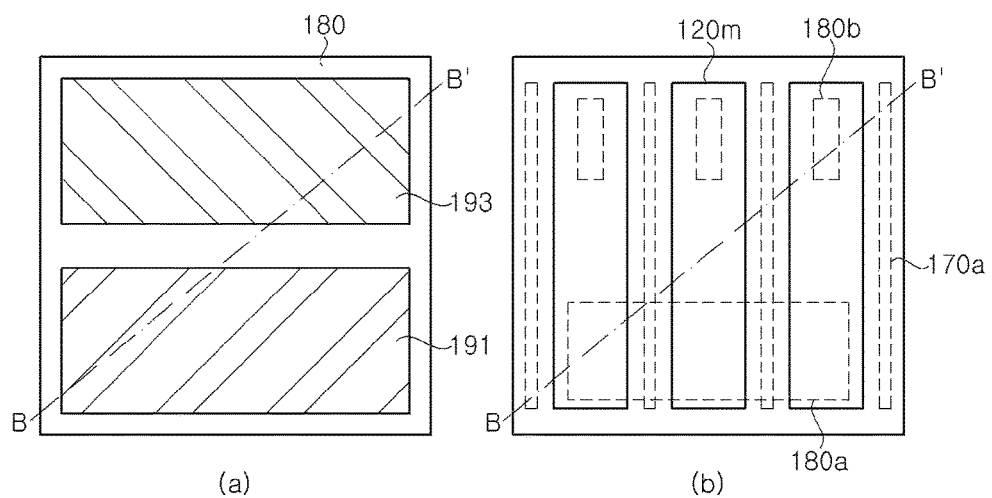
FIG. 10 and FIG. 11 are plan views and a cross-sectional view of a light emitting diode according to other exemplary embodiments of the present disclosure, respectively.
Figure 11:
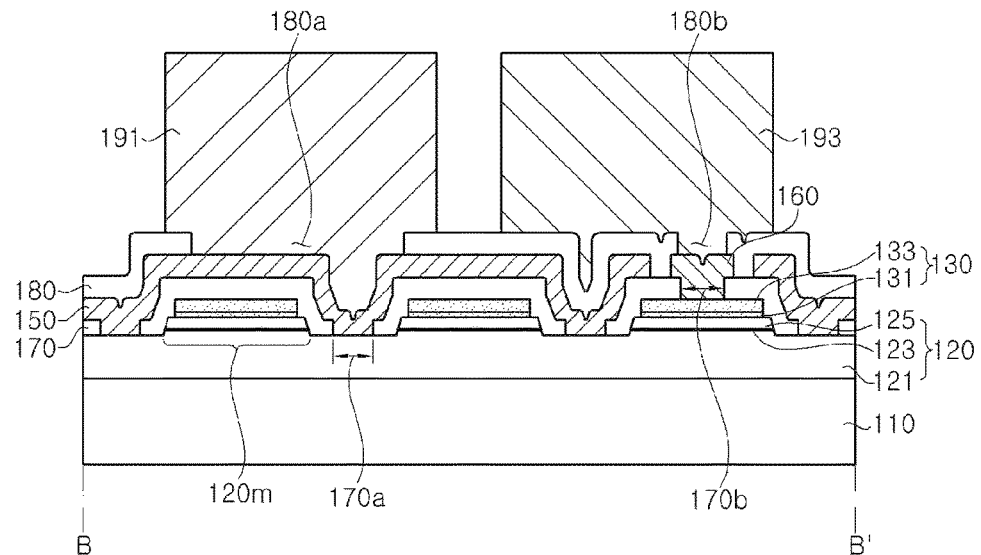

FIG. 10 and FIG. 11 are plan views and a cross-sectional view of a light emitting diode according to other exemplary embodiments of the present disclosure, respectively. FIG. 11 is a cross-sectional view taken along line B-B' of FIG. 10(*a*) and FIG. 10(*b*). FIG. 10(*b*) is a plan view illustrating arrangement of mesas 120*m*, a first opening 170*a*, a third opening 180*a* and fourth openings 180*b*. Detailed description of the same components as those of the above exemplary embodiments will be omitted.

Referring to FIG. 10 and FIG. 11, the light emitting diode includes a light emitting structure 120, a ZnO transparent electrode 130, a first electrode 150, and insulation layers 170, 180. In addition, the light emitting diode may further include a substrate 110, a connection electrode 160, a first electrode pad 191, and a second electrode pad 193. The light emitting diode according to this exemplary embodiment is provided as one example of a flip chip type light emitting diode and the ZnO transparent electrode 130 may be applied to the vertical type light emitting diode as in this exemplary embodiment.

As described above, the substrate 110 may be a growth substrate for growth of the light emitting structure 120. The substrate 110 may be omitted in the light emitting diode according to this exemplary embodiment. For example, when the substrate 110 is used as a growth substrate for growth of the light emitting structure, the substrate 110 may be removed from the light emitting structure 120 by a process known to those skilled in the art. Alternatively, the substrate 110 may be a support substrate for supporting the light emitting structure 120 grown on a separate growth substrate.

The light emitting structure 120 may include a first conductivity type semiconductor layer 121, an active layer 123 disposed on the first conductivity type semiconductor layer 121, and a second conductivity type semiconductor layer 125 disposed on the active layer 123. The light emitting structure 120 may include a region formed to partially expose the first conductivity type semiconductor layer 121 through the second conductivity type semiconductor layer 125 and the active layer 123. The light emitting structure 120 may include at least one mesa 120*m*, which includes the active layer 123 and the second conductivity type semiconductor layer 125. In this exemplary embodiment, the light emitting structure 120 may include a plurality of mesas 120*m*, which have an elongated shape and extend substantially in the same direction.

The ZnO transparent electrode 130 may be disposed on the second conductivity type semiconductor layer 125. The ZnO transparent electrode 130 may be electrically connected to the second conductivity type semiconductor layer 125 and may form ohmic contact with the second conductivity type semiconductor layer 125. The ZnO transparent electrode 130 may cover substantially the entire upper surface of the mesa 120*m*. The ZnO transparent electrode 130 may include a ZnO seed layer 131 and a ZnO bulk layer 133.

Electric current supplied to the light emitting diode through the ZnO transparent electrode 130 can be uniformly spread in the horizontal direction on the light emitting structure 120, thereby improving current spreading performance of the light emitting diode. In addition, the ZnO transparent electrode 130 has relatively high light transmittance, thereby minimizing loss of light passing through the ZnO transparent electrode 130. In addition, the light emitting diode has improved ohmic characteristics and current spreading efficiency to reduce forward voltage (Vf) of the light emitting diode while improving luminous efficacy of the light emitting diode through improvement in light transmittance.

The insulation layers 170, 180 may include a first insulation layer 170 and a second insulation layer 180. Hereinafter, the first insulation layer 170 will first be described.

The first insulation layer 170 may cover the upper surfaces of the light emitting structure 120 and the ZnO transparent electrode 130, and may include first openings 170*a* partially exposing the first conductivity type semiconductor layer 121 and second openings 170*b* partially exposing the ZnO transparent electrode 130. Although there is no limitation as to the number and arrangement of the first and second openings 170a, 170b, for example, the first openings 170a may be arranged around the mesas 120m and may have an elongated shape extending substantially in the same direction in which the mesas 120m extend. The second opening 170b may be disposed on at least one mesa 120m, for example, on each of three mesas 120m.

The first insulation layer 170 may include an insulating material, for example, $SiO_2$, SiNx, $MgF_2$, and the like. In some exemplary embodiments, the first insulation layer 170 may include a distributed Bragg reflector. The distributed Bragg reflector may be formed by repeatedly stacking dielectric layers having different indices of refraction one above another. For example, the dielectric layers may include $TiO_2$, $SiO_2$, $HfO_2$, $ZrO_2$, $Nb_2O_5$, or others. Each layer of the distributed Bragg reflector may have an optical thickness of $\lambda/4$ and the distributed Bragg reflector may be composed of 4 to 20 pairs of layers.

The distributed Bragg reflector may have a relatively high reflectance with respect to visible light. The distributed Bragg reflector may be designed to have a reflectance of 90% or more with respect to light having an incidence angle of 0° to 60° and a wavelength of 400 nm to 700 nm. The distributed Bragg reflector having a reflectance within this range can be provided by controlling the kind, thickness, and stacking period of dielectric layers forming the distributed Bragg reflector. As a result, the distributed Bragg reflector can be formed to have high reflectance with respect to light having a relatively long wavelength (for example, 550 nm to 700 nm) and light having a relatively short wavelength (for example, 400 nm to 550 nm).

In this way, the distributed Bragg reflector may include a multilayer structure so as to have high reflectance with respect to light in a broad range of wavelengths. That is, the distributed Bragg reflector may include a first stack structure of dielectric layers each having a first thickness and a second stack structure of dielectric layers each having a second thickness. For example, the distributed Bragg reflector may include a first stack structure of dielectric layers each having a smaller thickness than an optical thickness of $\lambda/4$ with respect to light having a central wavelength (about 550 nm) of visible light and a second stack structure of dielectric layers each having a greater thickness than an optical thickness of $\lambda/4$ with respect to light having a central wavelength (about 550 nm) of visible light. In addition, the distributed Bragg reflector may further include a third stack structure in which dielectric layers each having a greater thickness than an optical thickness of $\lambda/4$ with respect to light having a central wavelength (about 550 nm) of visible light and dielectric layers each having a greater thickness than an optical thickness of $\lambda/4$ with respect to light having a central wavelength (about 550 nm) of visible light are repeatedly stacked one above another.

The distributed Bragg reflector of the first insulation layer 170 covering substantially the entire upper surface of the light emitting structure 120 reflects light, thereby improving luminous efficacy of the light emitting diode. In addition, as described above, since the ZnO transparent electrode 130 has high light transmittance, the ratio of light loss through absorption in the ZnO transparent electrode 130 among light reflected by the distributed Bragg reflector can be reduced, thereby improving luminous efficacy of the light emitting diode.

The first electrode 150 may form ohmic contact with the first conductivity type semiconductor layer 121 through the first opening 170a while covering substantially the entirety of the first insulation layer 170. In addition, the first electrode 150 is separated from the second opening 170b. The first electrode 150 may be composed of a single layer or multiple layers and may include a metallic material capable of forming ohmic contact with the first conductivity type semiconductor layer 121. The first electrode 150 may include a reflective metallic material. The connection electrode 160 may be electrically connected to the ZnO transparent electrode 130 through the second opening 170b of the first insulation layer 170.

The first electrode 150 and the connection electrode 160 may be formed by the same process. In this case, the first electrode 150 and the connection electrode 160 may have the same stack structure and/or the same materials. Accordingly, the first electrode 150 and the connection electrode 160 may have substantially the same thickness. Alternatively, the first electrode 150 and the connection electrode 160 may be formed by different processes. The first electrode 150 and/or the connection electrode 160 may include at least one of Ni, Pt, Pd, Rh, W, Ti, Al, Mg, Ag or Au. Alternatively, the connection electrode 160 may be omitted.

The second insulation layer 180 covers the first electrode 150 and includes a third opening 180a partially exposing the first electrode 150 and a fourth opening 180b partially exposing the connection electrode 160 (or the ZnO transparent electrode 130). The third opening 180a may act as a passage through which the first electrode 150 is electrically connected to the first electrode pad 191, and the fourth opening 180b may act as a passage through which the connection electrode 160 (or the ZnO transparent electrode 130) is electrically connected to the second electrode pad 193.

The second insulation layer 180 may be composed of a single layer or multiple layers and may include an insulating material, for example, $SiO_2$, $SiN_x$, $MgF_2$, or others. The second insulation layer 180 may also include a distributed Bragg reflector. The distributed Bragg reflector of the second insulation layer 180 is substantially similar to that of the first insulation layer 170 and detailed description thereof is omitted herein. In the second insulation layer 180 composed of multiple layers, the uppermost layer of the second insulation layer 180 may be formed of $SiN_x$. The layer formed of $SiN_x$ has good moisture desorption to protect the light emitting diode from moisture.

The first electrode pad 191 and the second electrode pad 193 are placed on an upper insulating layer 173. The first electrode pad 191 may be electrically connected to the first electrode 150 through the third opening 180a and the second electrode pad 193 may be electrically connected to the connection electrode 160 (or the ZnO transparent electrode 130) through the fourth openings 180b. Each of the first electrode pad 191 and the second electrode pad 193 may be composed of a single layer or multiple layers and may include a metallic material.

As such, the ZnO transparent electrode 130 according to the exemplary embodiments may be applied to flip-chip type light emitting diodes and can improve electrical and optical characteristic of the light emitting diode.

FIG. 12 to FIG. 19 are sectional views illustrating a method of manufacturing a light emitting diode according to other exemplary embodiments of the present disclosure.

Figure 12:
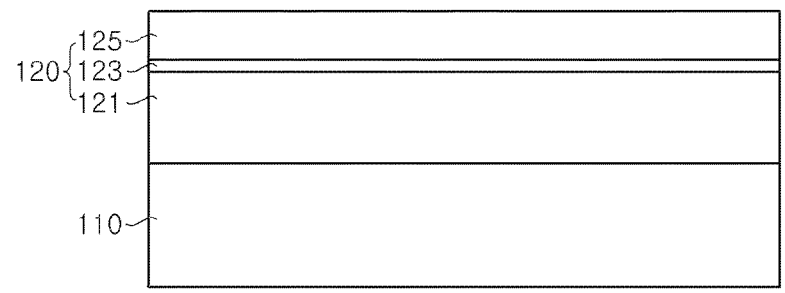
FIG. 12 to FIG. 19 are sectional views illustrating a method of manufacturing a light emitting diode according to other exemplary embodiments of the present disclosure and a method of manufacturing the same.

Referring to FIG. 12, a light emitting structure 120 may be formed on a substrate 110.

The substrate 110 may be selected from any substrates allowing growth of the light emitting structure 120 thereon and may include, for example, a sapphire substrate, a silicon carbide substrate, a gallium nitride substrate, an aluminum nitride substrate, a silicon substrate, or the like. In this exemplary embodiment, the substrate 110 may be a patterned sapphire substrate (PSS).

The light emitting structure 120 includes a first conductivity type semiconductor layer 121, an active layer 123 disposed on the first conductivity type semiconductor layer 121, and a second conductivity type semiconductor layer 125 disposed on the active layer. The first conductivity type semiconductor layer 121, the active layer 123 and the second conductivity type semiconductor layer 125 are similar to those described with reference to FIG. 1 and repeated description thereof will be omitted. The first conductivity type semiconductor layer 121, the active layer 123, and the second conductivity type semiconductor layer 125 may be grown on the substrate 110 by a process such as MOCVD, MBE, and the like. The substrate 110 may be removed from the light emitting diode through a laser lift-off (LLO) process or the like.

Figure 13:
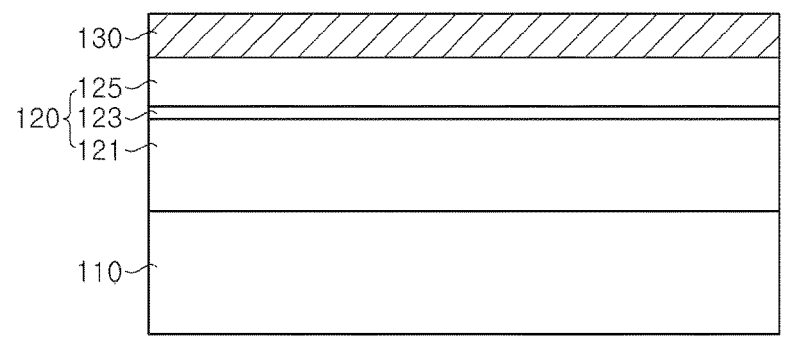

Referring to FIG. 13, a ZnO transparent electrode 130 may be formed on the second conductivity type semiconductor layer 125. The process of forming the ZnO transparent electrode 130 may include forming a ZnO seed layer (not shown) and forming a ZnO bulk layer (not shown) on the ZnO seed layer 131. The ZnO bulk layer may be grown using the ZnO seed layer as a seed.

The method of forming the ZnO seed layer and the crystal structure thereof are similar to those of the ZnO seed layer 131 described with reference to FIG. 2 and repeated description thereof will be omitted.

The ZnO seed layer can act as a seed for growth of the ZnO bulk layer (not shown) described below and can also act to form ohmic contact with the second conductivity type semiconductor layer 125. Particularly, the ZnO seed layer may be formed of undoped ZnO and improves crystallinity of the ZnO bulk layer formed by a subsequent process. The ZnO seed layer may have a thinner thickness than the ZnO bulk layer described below and may have a thickness of, for example, several to dozens of nanometers.

Then, the ZnO bulk layer is formed on the ZnO seed layer, thereby forming the ZnO transparent electrode. As a result, the light emitting structure 120 and the ZnO transparent electrode 130 disposed on the light emitting structure 120 can be formed.

The ZnO bulk layer may be formed on the second conductivity type semiconductor layer 125 through various methods. For example, the ZnO bulk layer may be formed on the second conductivity type semiconductor layer 125 through hydrothermal synthesis. The process of forming the ZnO bulk layer may include forming a monocrystalline ZnO layer on the light emitting structure 120 through hydrothermal synthesis using a solution containing a ZnO precursor. Here, the monocrystalline ZnO layer may be grown from the ZnO seed layer. In addition, the process of forming the ZnO bulk layer may further include subjecting the monocrystalline ZnO layer formed through hydrothermal synthesis to heat treatment. Heat treatment of the ZnO layer may be performed at about 200° C. to about 300° C. under a nitrogen atmosphere. By heat treatment, the ZnO bulk layer 133 can have reduced sheet resistance and improved light transmittance (reduction in absorptivity).

The method of forming the ZnO bulk layer is not limited thereto. The ZnO bulk layer may be formed by any methods capable of forming the ZnO bulk layer so as to have substantially the same crystallinity as the ZnO seed layer. For example, the ZnO bulk layer may be formed by sol-gel synthesis, vacuum deposition such as atomic layer deposition (ALD), pulsed laser deposition (PLD), molecular beam epitaxy (MBE), metal organic chemical vapor deposition (MOCVD), and RF-sputtering, electrochemical deposition, dip coating, spin coating, and the like.

The ZnO transparent electrode 130 may have a total thickness of about 800 nm or more, specifically 800 nm to 900 nm. As the total thickness of the ZnO transparent electrode 130 is increased to about 800 nm or more, stress and strain caused by lattice mismatch of the ZnO transparent electrode 130 can be remarkably reduced. As such, the ZnO transparent electrode 130 may be formed to a thickness of about 800 nm or more, thereby improving crystallinity of the ZnO transparent electrode 130. In addition, since monocrystalline ZnO has better light transmittance than an ITO transparent electrode, the monocrystalline ZnO layer can be formed to a greater thickness than the ITO transparent electrode. When the ITO transparent electrode is formed to a thickness of 200 nm or more, the ITO transparent electrode has low light transmittance, causing increase in light absorptivity. On the contrary, since the monocrystalline ZnO has relatively good light transmittance, the monocrystalline ZnO layer can be formed to a thickness of several hundred nanometers or more and does not suffer from significant increase in light absorptivity when the monocrystalline ZnO layer is formed to several micrometers, thereby improving light extraction efficiency of the light emitting diode. That is, the ZnO transparent electrode 130 having a thickness of about 800 nm or more can have light transmittance similar to or higher than the ITO transparent electrode. As such, the ZnO transparent electrode 130 has a thickness of about 800 nm or more, thereby improving crystallinity and current spreading efficiency in the ZnO transparent electrode 130. Accordingly, the light emitting diode according to this exemplary embodiment has lower forward voltage (Vf) and higher luminous efficacy than a light emitting diode to which the ITO transparent electrode is applied.

As the current spreading efficiency of the ZnO transparent electrode 130 is improved, the light emitting diode may not include a current blocking layer (CBL) under the ZnO transparent electrode 130. Specifically, the entire lower surface of the ZnO transparent electrode 130 may adjoin an upper surface of the second conductivity type semiconductor layer 125. Generally, the current blocking layer is formed to secure current spreading efficiency. However, since the light emitting diode according to this exemplary embodiment includes the ZnO transparent electrode 130, it is possible to achieve sufficient current spreading even without the current blocking layer. In addition, the light emitting diode according to the exemplary embodiments omits the current blocking layer, thereby solving the problem of electric discharge caused by the current blocking layer. Furthermore, the light emitting diode according to the exemplary embodiments allows simplification of the manufacturing process through omission of the current blocking layer.

Furthermore, since the light emitting diode according to the exemplary embodiments omits the current blocking layer, there is no need for formation of a reference line through exposure of the first conductivity type semiconductor layer 121 to designate a location at which the current blocking layer will be formed. Accordingly, it is not necessary to perform the process of partially exposing the first conductivity type semiconductor layer 121 prior to the process of forming the ZnO transparent electrode 130. Thus, the process of partially exposing the first conductivity type semiconductor layer 121 by partially removing the second conductivity type semiconductor layer 125 and the active layer 123 and the process of partially removing the ZnO transparent electrode 130 in a predetermined pattern may be performed at the same time using the same mask. As a result, the light emitting diode according to the exemplary embodiments enables simplification of the manufacturing process and can reduce manufacturing costs.

Figure 14:
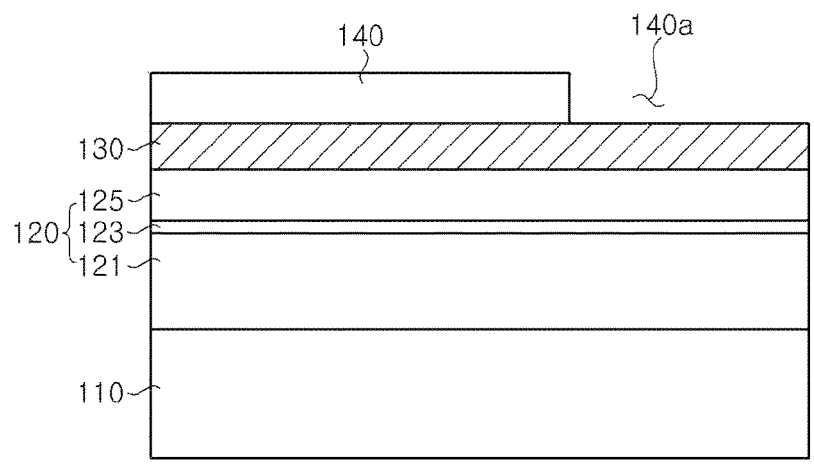

Referring to FIG. 14, a mask 140 may be formed on the ZnO transparent electrode 130. Specifically, the mask 140 may include an opening 140a that partially exposes the ZnO transparent electrode 130. The opening 140a serves to designate regions from which the ZnO transparent electrode 130, the second conductivity type semiconductor layer 125 and the active layer 123 will be removed. The mask 140 may be formed of a photosensitive resin, without being limited thereto.

Figure 15:
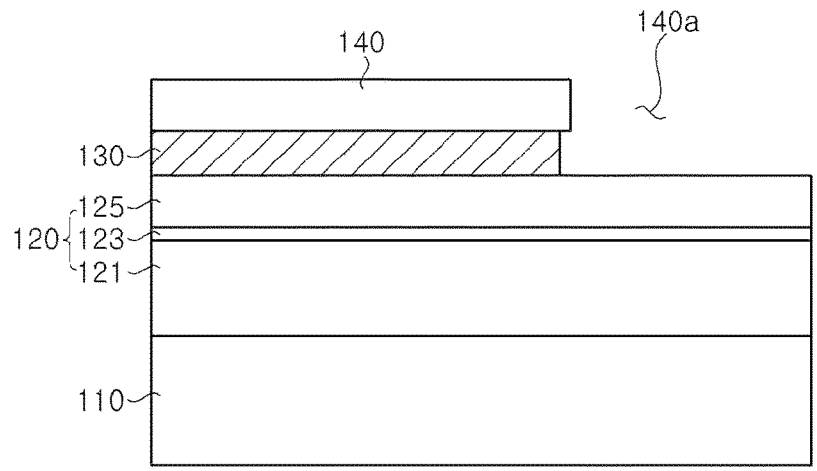

Referring to FIG. 15, the second conductivity type semiconductor layer 125 is exposed by removing a portion of the ZnO transparent electrode 130 exposed through the opening 140a. The ZnO transparent electrode 130 may be partially removed by wet etching. Here, a side surface of the ZnO transparent electrode 130 may be removed along a certain crystal plane by etching using an etchant such as BOE. As a result, as shown in FIG. 15, the side surface of the ZnO transparent electrode 130 exposed by etching may be perpendicular to the upper surface of the second conductivity type semiconductor layer 125. In addition, since the etching rate with respect to the ZnO transparent electrode 130 is high, the side surface of the ZnO transparent electrode 130 may not be coplanar with a side surface of the opening 140a. Specifically, as shown in FIG. 15, the side surface of the ZnO transparent electrode 130 may be indented from a side surface of the mask 140. Accordingly, upon formation of a mesa M described below, the ZnO transparent electrode 130 may be recessed a predetermined distance from an outer periphery of the upper surface of the second conductivity type semiconductor layer 125.

Although the ZnO transparent electrode 130 is removed by wet etching in this exemplary embodiment, it should be understood that other implementations are possible. For example, the ZnO transparent electrode 130 may be removed by dry etching. In this case, the process of partially removing the second conductivity type semiconductor layer 125 and the active layer 123 through dry etching may be sequentially performed, thereby simplifying the manufacturing process.

Figure 16:
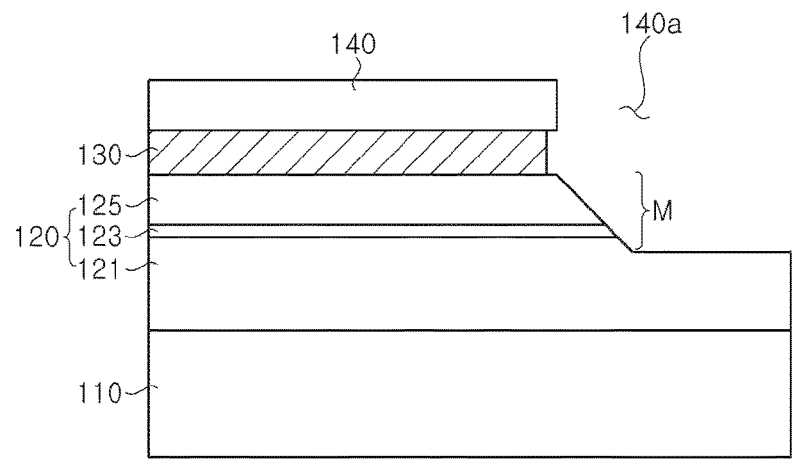

Referring to FIG. 16, the first conductivity type semiconductor layer 121 may be exposed by removing a portion of the second conductivity type semiconductor layer 125 exposed through the opening 140a and a portion of the active layer 123 disposed under the exposed portion of second conductivity type semiconductor layer 125. Specifically, the second conductivity type semiconductor layer 125 and the active layer 123 may be partially removed by dry etching, such as ICP. Removal of the ZnO transparent electrode 130 and removal of the second conductivity type semiconductor layer 125 and the active layer 123 may be performed by the same process, for example, dry etching. Although the second conductivity type semiconductor layer 125 and the active layer 123 are partially removed by dry etching in this exemplary embodiment, it should be understood that the removal process is not limited to dry etching.

Figure 17:
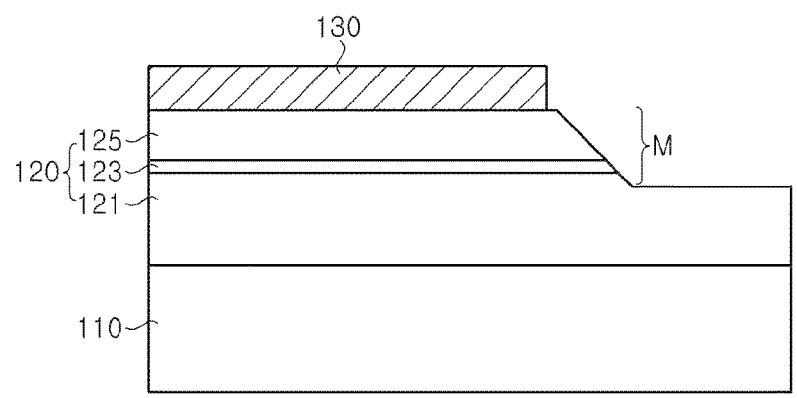

The exposed region of the first conductivity type semiconductor layer 121 may be formed by partially removing the second conductivity type semiconductor layer 125 and the active layer 123 to form a mesa M including the second conductivity type semiconductor layer 125 and the active layer 123. As shown in FIG. 16, the mesa M may be formed to have an inclined side surface through a technique such as photoresist reflow. Alternatively, the light emitting structure 120 may include at least one hole (not shown) formed to expose the first conductivity type semiconductor layer 121 through the second conductivity type semiconductor layer 125 and the active layer 123. Thereafter, the mask 140 may be removed, as shown in FIG. 17.

Figure 18:
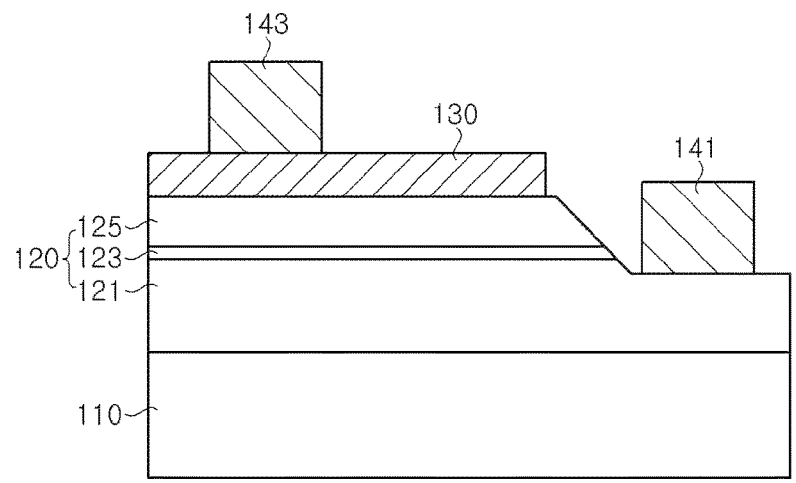

Referring to FIG. 18, a first electrode 141 and a second electrode 143 may be formed.

The first electrode 141 may be formed on the exposed region of the first conductivity type semiconductor layer 121, which is formed by partially removing the second conductivity type semiconductor layer 125 and the active layer 123. The first electrode 141 may be electrically connected to the first conductivity type semiconductor layer 121. The first electrode 141 may include a highly reflective metal layer, such as an Al layer. The highly reflective metal layer may be formed on a bonding layer, such as a Ti, Cr or Ni layer. Further, a protective layer composed of a single layer or composite layer of Ni, Cr, Au, or others may be formed on the highly reflective metal layer. The first electrode 140 may have a multilayer structure of, for example, Ti/Al/Ti/Ni/Au. The first electrode 140 may be formed by deposition of metallic materials, followed by patterning. The first electrode 141 may be formed by e-beam evaporation, vacuum deposition, sputtering, or MOCVD.

The second electrode 143 may be formed on the ZnO transparent electrode 130. The second electrode 143 may be electrically connected to the second conductivity type semiconductor layer 125. The second electrode 143 may include a reflective layer and a protective layer covering the reflective layer. The second electrode 143 can reflect light while forming ohmic contact with the second conductivity type semiconductor layer 125. Thus, the reflective layer may include a metal having high reflectance and capable of forming ohmic contact with the second conductivity type semiconductor layer 125. For example, the reflective layer may include at least one of Ni, Pt, Pd, Rh, W, Ti, Al, Ag or Au. Further, the reflective layer may include a single layer or multiple layers. The second electrode 143 may be formed by e-beam evaporation, vacuum deposition, sputtering, or MOCVD.

Figure 19:
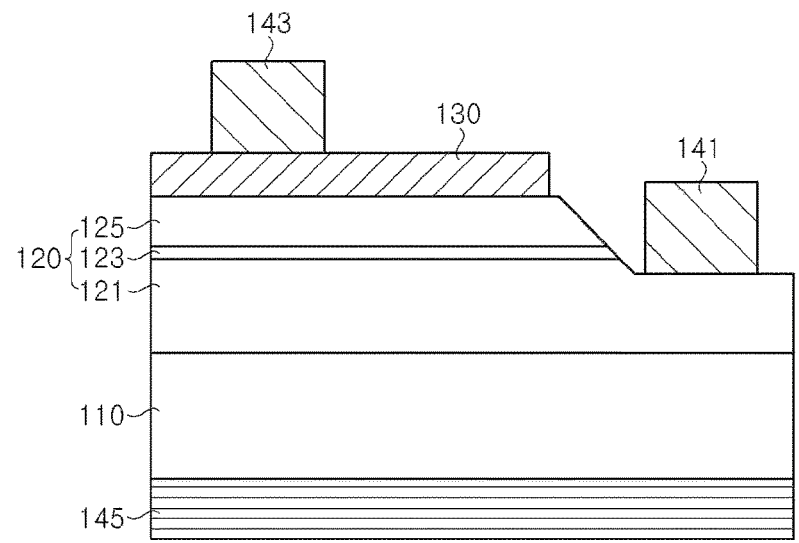

The light emitting diode according to the exemplary embodiments may further include a distributed Bragg reflector 145. Referring to FIG. 19, the distributed Bragg reflector 145 may be formed on a lower surface of the substrate 110. The distributed Bragg reflector 145 serves to reflect light emitted from the active layer 125 to the lower surface of the substrate 110, thereby improving light extraction efficiency. The distributed Bragg reflector may include a stack structure of $TiO_2/SiO_2$ layers alternately stacked one above another and the wavelength of light reflected by the distributed Bragg reflector can be regulated through control of thickness of each layer constituting the distributed Bragg reflector.

Figure 20:
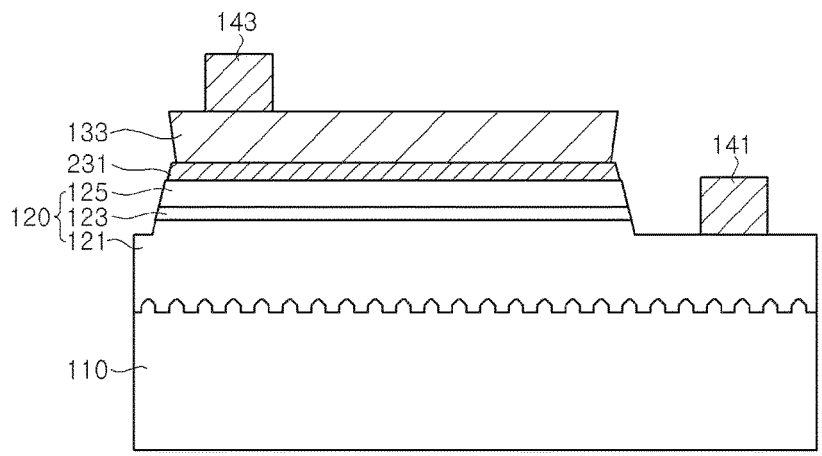
FIG. 20 is a schematic sectional view of a light emitting diode according to yet another exemplary embodiment of the present disclosure.

FIG. 20 is a schematic sectional view of a light emitting diode according to yet another exemplary embodiment of the present disclosure.

Referring to FIG. 20, the light emitting diode includes a substrate 110, a light emitting structure 120, an ITO layer 231, a ZnO layer 133, an n-electrode 141, and a p-electrode 143. In addition, the light emitting structure 120 includes an n-type semiconductor layer 121, an active layer 123, and a p-type semiconductor layer 125.

The substrate 110 may be a growth substrate for growing a gallium nitride semiconductor layer and may include a sapphire substrate, a silicon carbide substrate, a silicon substrate, a gallium nitride substrate, an aluminum nitride substrate, or the like. For example, the substrate 110 may be a patterned sapphire substrate (PSS) having a predetermined pattern on an upper surface thereof. However, the substrate 110 is not limited to the growth substrate and may be a conductive or insulating support substrate.

The light emitting structure 120 may include an n-type semiconductor layer 121, a p-type semiconductor layer 125 disposed on the n-type semiconductor layer 121, and an active layer 123 interposed between the n-type semiconductor layer 121 and the p-type semiconductor layer 125.

The n-type semiconductor layer 121, the active layer 123 and the p-type semiconductor layer 125 may include Group III-V based nitride semiconductors, for example, nitride semiconductors such as (Al, Ga, In)N. The n-type semiconductor layer 121, the active layer 123 and the p-type semiconductor layer 125 may be formed in a chamber by a growth method well-known to those skilled in the art, such as MOCVD. The n-type semiconductor layer 121 may include n-type dopants (for example, Si, Ge, Sn) and the p-type semiconductor layer 125 may include p-type dopants (for example, Mg, Sr, Ba). For example, the n-type semiconductor layer 121 may include GaN including Si dopants and the p-type semiconductor layer 125 may include GaN including Si dopants. The active layer 123 may include a single quantum well structure or a multiple quantum well (MQW) structure and the composition ratio of the nitride semiconductor thereof may be adjusted to emit light having a desired wavelength.

The ITO layer 231 is disposed on the p-type semiconductor layer 125 to form ohmic contact with the p-type semiconductor layer 125. In a typical technique wherein the ITO layer is used as a transparent electrode layer, the ITO layer is formed to a thickness of 60 nm or more in order to secure current spreading. However, according to this exemplary embodiment, the ITO layer 231 may have a thickness allowing formation of ohmic contact. For example, the ITO layer 231 may have a thickness of 10 nm or less, specifically 5 nm or less.

The ITO layer 231 may be formed on the p-type semiconductor layer 125 by e-beam evaporation or sputtering, and may be subjected, together with the ZnO layer 133 described below, to patterning so as to be placed in a limited region of the p-type semiconductor layer 125.

The ZnO layer 133 is disposed on the ITO layer 231. The ZnO layer 133 may be formed to a greater thickness than the ITO layer 231 and allows uniform current spreading in the p-type semiconductor layer 125. Since the ZnO layer 133 has low light absorptivity, the ZnO layer 133 may be formed to a relatively thick thickness. For example, the ZnO layer 133 may be formed to a thickness of 60 nm or more, specifically 100 nm or more. The thickness of the ZnO layer 133 is not limited to a particular upper limit and may be, for example, several micrometers.

The ZnO layer 133 may be formed by, for example, hydrothermal synthesis. In this exemplary embodiment, since the ITO layer 231 acts as a seed layer, there is no need for formation of a separate seed layer. The ZnO layer 133 may be formed of a film-shaped continuous single crystal instead of a polycrystalline structure composed of columnar crystals.

For example, the ZnO layer 133 may be formed on the ITO layer 133 through hydrothermal synthesis using a solution containing a ZnO precursor. The ZnO layer 133 formed through hydrothermal synthesis may be subjected to heat treatment at about 200° C. to about 300° C. under a nitrogen atmosphere. By heat treatment, the ZnO bulk layer 133 can have reduced sheet resistance and improved light transmittance.

In addition, the ZnO layer 133 may further include a dopant. The ZnO layer 133 may include a metallic dopant. For example, the ZnO layer 133 may include at least one of silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), or palladium (Pd). In this exemplary embodiment, the ZnO layer 133 may be formed of Ga-doped ZnO (GZO). The ZnO layer 133 containing a metallic dopant can further reduce sheet resistance, thereby enabling more uniform current spreading in the horizontal direction. Alternatively, the ZnO layer 133 may be formed of undoped ZnO.

Next, a method of manufacturing the light emitting diode according to this exemplary embodiment will be described in brief. First, an n-type semiconductor layer, an active layer and a p-type semiconductor layer are grown on the substrate 110. Then, an ITO layer and a ZnO layer are formed on the p-type semiconductor layer.

Thereafter, the ZnO layer and the ITO layer are subjected to photolithography and etching such that the ZnO layer 133 and the ITO layer 231 can remain in some regions on the p-type semiconductor layer while allowing the ZnO layer and the ITO layer to be removed from the remaining region on the p-type semiconductor layer. Here, the ZnO layer and the ITO layer may be removed by wet etching. Then, the p-type semiconductor layer 125 and the active layer 123 of the light emitting structure 120 are formed by patterning the p-type semiconductor layer and the active layer through dry etching.

On the other hand, the ZnO layer 133 may be formed to have an inversely inclined side surface during wet etching. On the contrary, the ITO layer 231 may have a side surface inclined in an opposite direction to the inclined side surface of the ZnO layer 133 or may have a perpendicular side surface. Although the area of the ZnO layer 133 is reduced by wet etching, the area of the ZnO layer 133 may be 90% or more of the area of the p-type semiconductor layer 125 of the light emitting structure 120.

Then, the n-electrode 141 is formed on the n-type semiconductor layer 121 of the light emitting structure 120 and the p-electrode 143 is formed on the ZnO layer 133. The n-electrode 141 and the p-electrode 143 may be formed of the same metallic material or different metallic material. In addition, each of the n-electrode 141 and the p-electrode 143 may have a single layer structure or multilayer structure. For example, each of the n-electrode 141 and the p-electrode 143 may have a multilayer structure of Cr/Al/Cr/Ni/Au. The p-electrode 142 of the multilayer structure is formed on the ZnO layer 133, thereby improving bonding strength of the p-electrode 143.

According to this exemplary embodiment, the light emitting diode includes both the ITO layer 231 and the ZnO layer 133, thereby improving reliability of ohmic contact resistance and current spreading performance.

Figure 21:
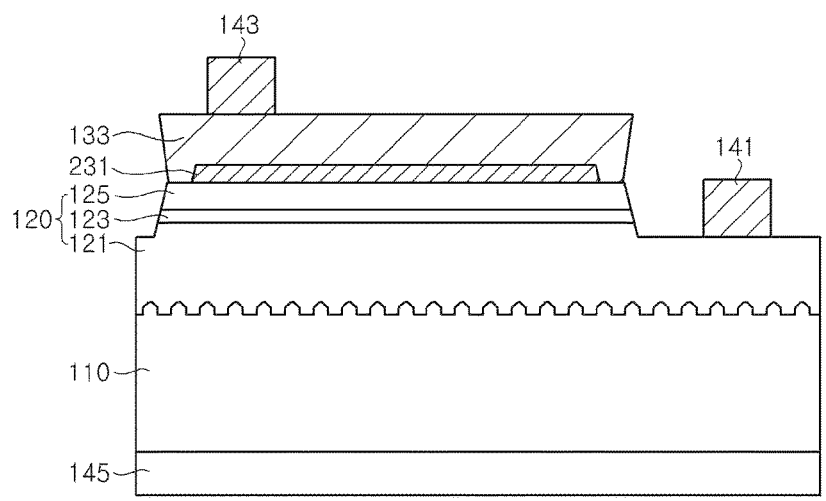
FIG. 21 is a schematic sectional view of a light emitting diode according to yet another exemplary embodiment of the present disclosure.

FIG. 21 is a schematic sectional view of a light emitting diode according to yet another exemplary embodiment of the present disclosure.

Referring to FIG. 21, the light emitting diode according to this exemplary embodiment is generally similar to the light emitting diode described with reference to FIG. 20 except that the ZnO layer 133 covers upper and lower surfaces of the ITO layer 231 and a distributed Bragg reflector (DBR) 145 is disposed on the lower surface of the substrate 110.

That is, in the light emitting diode shown in FIG. 20, the side surface of the ITO layer 231 is exposed to the outside of the light emitting diode. On the contrary, according to this exemplary embodiment, the side surface of the ITO layer 231 is shielded by the ZnO layer 133 so as not to be exposed. With this structure, when light is emitted from the light emitting diode, the light is emitted through the substrate 110, the light emitting structure 120 and the surface of the ZnO layer 133, and light emitted through the ITO layer 231 enters the ZnO layer 133.

On the other hand, the side surface of the ZnO layer 133 has an inversely inclined shape, as shown in FIG. 21. With the inversely inclined side surface, the ZnO layer 133 has an acute angle of less than 90 degrees at an upper edge thereof, thereby preventing light loss caused by internal total reflection in the ZnO layer 133.

Since the ITO layer 231 and the ZnO layer 133 have a substantially similar index of refraction, significant total internal reflection does not occur at the interface between the ZnO layer 133 and the ITO layer 231. On the contrary, since there is a significant difference in index of refraction between the ITO layer 231 and air, total internal reflection can occur at the interface between the ITO layer 231 and air when the ITO layer 231 is exposed to the outside, thereby causing deterioration in luminous efficacy. Accordingly, as in this exemplary embodiment, the ITO layer 231 is surrounded by the inversely inclined ZnO layer 133 to prevent light loss caused by total internal reflection, thereby improving light extraction efficiency.

Furthermore, the DBR 141 may be disposed under the substrate 110 to reflect light traveling downward through the substrate 110. With this structure, the light emitting diode provides a further increase in flux of light traveling upward, whereby the ZnO layer 133 according to this exemplary embodiment further improves luminous efficacy of the light emitting diode.

The method of manufacturing the light emitting diode according to this exemplary embodiment is generally similar to the method of manufacturing the light emitting diode shown in FIG. 20 except that the ITO layer 231 and the ZnO layer 133 are formed by separate photolithography and etching processes. That is, unlike the exemplary embodiment shown in FIG. 20, an ITO layer is deposited and then subjected to pattering to form the ITO layer 231. Thereafter, a ZnO layer is deposited to cover upper and side surfaces of the ITO layer 231, followed by etching the ZnO layer such that the ZnO layer 133 covering upper and side surfaces of the ITO layer 231 remain. Then, the p-type semiconductor layer and the active layer are partially removed by dry etching, thereby forming the light emitting structure 120.

Figure 22:
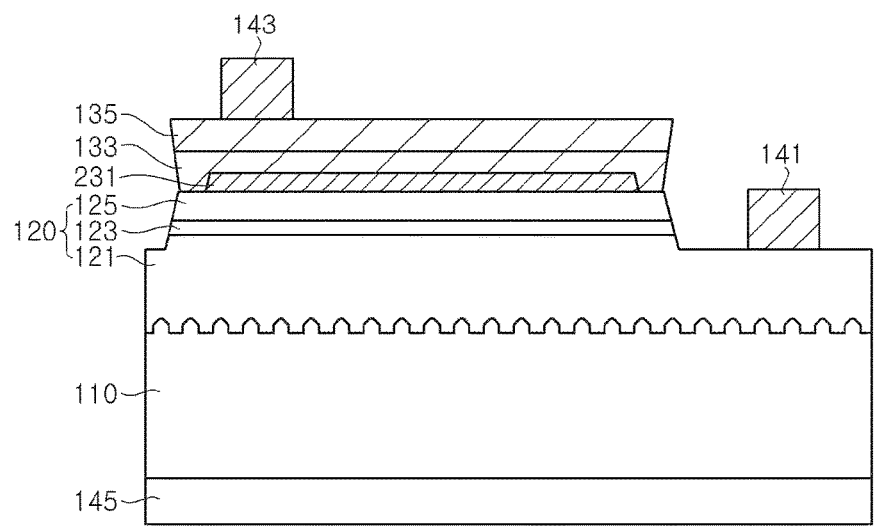
FIG. 22 is a schematic sectional view of a light emitting diode according to yet another exemplary embodiment of the present disclosure.

FIG. 22 is a schematic sectional view of a light emitting diode according to yet another exemplary embodiment of the present disclosure.

Referring to FIG. 22, the light emitting diode according to this exemplary embodiment is generally similar to the light emitting diode described with reference to FIG. 21 except that the ZnO transparent electrode layer includes a lower ZnO layer 133 having a high index of refraction and an upper ZnO layer 135 having a low index of refraction.

With the structure wherein the upper ZnO layer 135 having a low index of refraction is disposed on the lower ZnO layer 133 having a high index of refraction, the light emitting diode can enhance light extraction efficiency through the ZnO transparent electrode layer.

The indices of refraction of the ZnO layers 133, 135 may be adjusted by changing a wafer spinning rate upon deposition of ZnO through hydrothermal synthesis. That is, the upper ZnO layer 135 may be formed to have a more porous structure than the lower the ZnO layer 133 by controlling the wafer spinning rate to be higher upon formation of the upper ZnO layer 135 than upon formation of the lower ZnO layer 133. As a result, the upper ZnO layer 135 can have a lower index of refraction than the lower ZnO layer 133.

As shown in FIG. 21, both the lower ZnO layer 133 and the upper ZnO layer 135 have an inversely inclined shape and cover the upper and side surfaces of the ITO layer 231, thereby improving light extraction efficiency.

Although the transparent electrode layer is illustrated as a bilayer structure including the lower ZnO layer 133 and upper ZnO layer 135 in this exemplary embodiment, the transparent electrode layer may have a trilayer structure, the refractive index of which gradually decreases in the upward direction. Alternatively, the transparent electrode layer may be a refractive index-grading layer, the refractive index of which gradually decreases.

Figure 23:
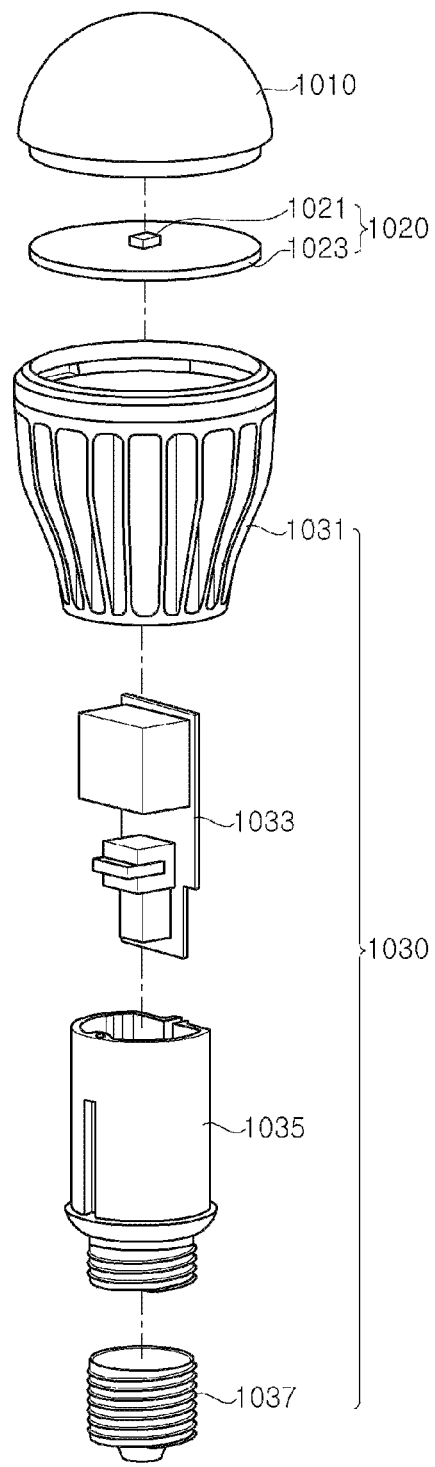
FIG. 23 is an exploded perspective view of a lighting apparatus to which a light emitting diode according to exemplary embodiments of the present disclosure is applied.

FIG. 23 is an exploded perspective view of a lighting apparatus to which a light emitting diode according to one exemplary embodiment is applied.

Referring to FIG. 23, the lighting apparatus according to this exemplary embodiment includes a diffusive cover 1010, a light emitting module 1020, and a body 1030. The body 1030 may receive the light emitting module 1020 and the diffusive cover 1010 may be disposed on the body 1030 to cover an upper side of the light emitting module 1020.

The body 1030 may have any shape so long as the body can supply electric power to the light emitting module 1020 while receiving and supporting the light emitting module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting module 1020, and may include at least one IC chip. The IC chip may regulate, change or control electric power supplied to the light emitting module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting module 1020 includes a substrate 1023 and a light emitting diode 1021 disposed on the substrate 1023. The light emitting module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of a light transmitting material and light orientation of the lighting apparatus may be adjusted through regulation of the shape and optical transmissivity of the diffusive cover 1010. Thus, the diffusive cover 1010 may be modified to have various shapes depending on usage and applications of the lighting apparatus.

Figure 24:
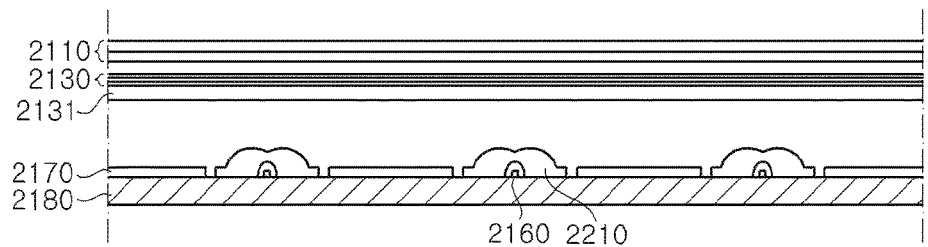
FIG. 24 is a cross-sectional view of one embodiment of a display apparatus to which a light emitting diode according to exemplary embodiments of the present disclosure is applied.

FIG. 24 is a cross-sectional view of one embodiment of a display apparatus to which a light emitting diode according to exemplary embodiments of the present disclosure is applied.

The display apparatus according to this exemplary embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the backlight unit includes a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed above the light emitting diode 2160. Light emitted from the light emitting diodes 2160 may be supplied in the form of sheet light to the display panel 2110 through the diffusive plate 2131 and the optical sheets 2130.

In this way, the light emitting diodes according to the exemplary embodiments may be applied to direct type displays like the display apparatus according to this exemplary embodiment.

Figure 25:
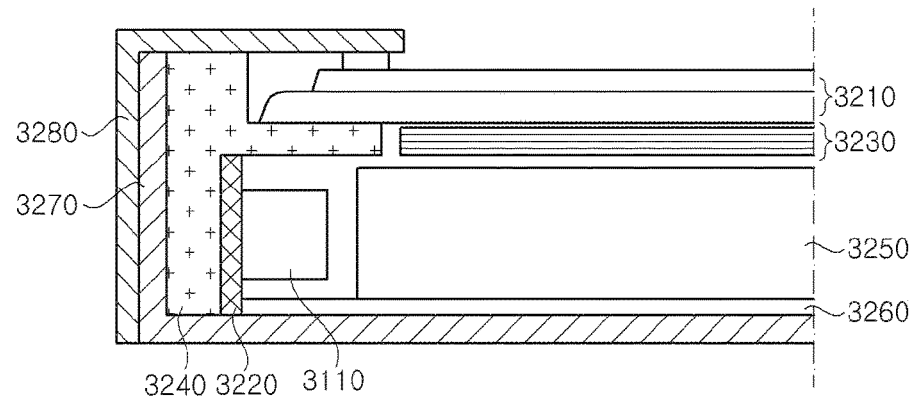
FIG. 25 is a cross-sectional view of another embodiment of a display apparatus to which a light emitting diode according to exemplary embodiments of the present disclosure is applied.

FIG. 25 is a cross-sectional view of another embodiment of the display apparatus to which a light emitting diode according to exemplary embodiments of the present disclosure is applied.

The display apparatus according to this exemplary embodiment includes a display panel 3210 on which an image is displayed, and a backlight unit disposed at a rear side of the display panel 3210 and emitting light thereto. Further, the display apparatus includes a frame 240 supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the exemplary embodiments may be applied to edge type displays like the display apparatus according to this exemplary embodiment.

Figure 26:
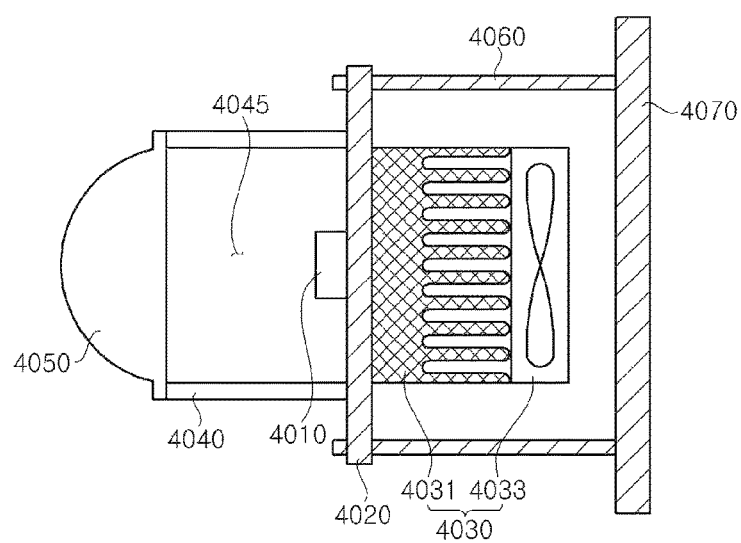
FIG. 26 is a cross-sectional view of a headlight to which a light emitting diode according to exemplary embodiments of the present disclosure is applied.

FIG. 26 is a cross-sectional view of a headlight to which a light emitting diode according to exemplary embodiments of the present disclosure is applied.

Referring to FIG. 26, the headlight according to this exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be separated from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting diode 4010.

In this way, the light emitting diodes according to the exemplary embodiments may be applied to headlights, particularly, headlights for vehicles, like the headlight according to this exemplary embodiment.

Although some exemplary embodiments have been described herein, it should be understood that these embodiments are provided for illustration only and are not to be construed in any way as limiting the present disclosure. It should be understood that features or components of one exemplary embodiment can also be applied to other exemplary embodiments without departing from the spirit and scope of the present disclosure.

The invention claimed is:

1. A light emitting diode comprising:
   a light emitting structure comprising a first conductivity type semiconductor layer, an active layer disposed on the first conductivity type semiconductor layer, and a second conductivity type semiconductor layer disposed on the active layer; and
   a ZnO transparent electrode disposed on the second conductivity type semiconductor layer to form ohmic contact with the second conductivity type semiconductor layer and comprising monocrystalline ZnO;
   wherein a diffraction angle of a peak of the ZnO transparent electrode obtained by XRD (X-Ray Diffraction) ω2θ scanning is in the range of ±1% with respect to a diffraction angle of a peak of the second conductivity type semiconductor layer obtained by XRD ω2θ scanning and a main peak of the ZnO transparent electrode obtained by XRD ω scanning has a full width at half maximum (FWHM) of 900 arc sec or less, and
   wherein the ZnO transparent electrode comprises a ZnO seed layer and a ZnO bulk layer disposed on the ZnO seed layer, the thickness of the ZnO bulk layer is between 90% and 100% of the thickness of the ZnO transparent electrode.

2. The light emitting diode according to claim 1, wherein the diffraction angle of the peak of the ZnO transparent electrode obtained by XRD ω2θ scanning is in the range of ±0.5% with respect to the diffraction angle of the peak of the second conductivity type semiconductor layer obtained by XRD ω2θ scanning.

3. The light emitting diode according to claim 1, wherein the main peak of the ZnO transparent electrode obtained by XRD ω scanning has an FWHM of 870 arc sec or less.

4. The light emitting diode according to claim 1, wherein the ZnO transparent electrode has a thickness of 800 nm or more.

5. The light emitting diode according to claim 1, wherein the ZnO seed layer comprises undoped ZnO and the ZnO bulk layer comprises monocrystalline ZnO doped with at least one of silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), or palladium (Pd).

6. The light emitting diode according to claim 1, wherein the ZnO transparent electrode comprises a plurality of voids.

7. The light emitting diode according to claim 1, wherein the second conductivity type semiconductor layer has a c-plane as a growth plane and the monocrystalline ZnO of the ZnO transparent electrode has a wurtzite crystal structure.

8. A method of manufacturing a light emitting diode, comprising:
   forming a light emitting structure, the light emitting structure comprising a first conductivity type semiconductor layer, an active layer disposed on the first conductivity type semiconductor layer, and a second conductivity type semiconductor layer disposed on the active layer; and
   forming a ZnO transparent electrode on the second conductivity type semiconductor layer to form ohmic contact with the second conductivity type semiconductor layer;
   wherein the forming of the ZnO transparent electrode comprises:
   forming a ZnO seed layer on the second conductivity type semiconductor layer; and
   forming a ZnO bulk layer on the ZnO seed layer using the ZnO seed layer as a seed;
   wherein the forming the ZnO bulk layer comprises forming a plurality of voids in the ZnO bulk layer.

9. The method of manufacturing a light emitting diode according to claim 8, wherein the forming the ZnO seed layer comprises:
   forming a ZnO layer on the second conductivity type semiconductor layer by spin coating; and
   subjecting the ZnO layer to heat treatment, and
   the ZnO seed layer forms ohmic contact with the second conductivity type semiconductor layer.

10. The method of manufacturing a light emitting diode according to claim 8, wherein the forming the ZnO bulk layer comprises:
    forming monocrystalline ZnO on the ZnO seed layer through hydrothermal synthesis; and
    subjecting the monocrystalline ZnO to heat treatment.

11. The method of manufacturing a light emitting diode according to claim 8, wherein the ZnO transparent electrode is formed to a thickness of 800 nm or more.

12. A light emitting diode comprising:
    a light emitting structure comprising a first conductivity type semiconductor layer, an active layer disposed on the first conductivity type semiconductor layer, and a second conductivity type semiconductor layer disposed on the active layer; and
    a ZnO transparent electrode disposed on the second conductivity type semiconductor layer to form ohmic contact with the second conductivity type semiconductor layer and comprising monocrystalline ZnO;
    wherein the ZnO transparent electrode comprises a plurality of voids.

13. The light emitting diode according to claim 12, wherein the ZnO transparent electrode has a thickness of 800 nm or more.

14. The light emitting diode according to claim 12, wherein a diffraction angle of a peak of the ZnO transparent electrode obtained by XRD (X-Ray Diffraction) ω2θ scanning is in the range of ±1% with respect to a diffraction angle of a peak of the second conductivity type semiconductor layer obtained by XRD ω2θ scanning and a main peak of the ZnO transparent electrode obtained by XRD ω scanning has a full width at half maximum (FWHM) of 900 arc sec or less.

15. The light emitting diode according to claim 14, wherein the diffraction angle of the peak of the ZnO transparent electrode obtained by XRD ω2θ scanning is in the range of ±0.5% with respect to the diffraction angle of the peak of the second conductivity type semiconductor layer obtained by XRD ω2θ scanning.

16. The light emitting diode according to claim 14, wherein the main peak of the ZnO transparent electrode obtained by XRD ω scanning has an FWHM of 870 arc sec or less.

17. The light emitting diode according to claim 14, wherein the ZnO transparent electrode comprises a ZnO seed layer and a ZnO bulk layer disposed on the ZnO seed layer, the ZnO bulk layer having a greater thickness than the ZnO seed layer.

18. The light emitting diode according to claim 17, wherein the thickness of the ZnO bulk layer is between 90% and 100% of the thickness of the ZnO transparent electrode.

19. The light emitting diode according to claim 18, wherein the ZnO seed layer comprises undoped ZnO and the ZnO bulk layer comprises monocrystalline ZnO doped with at least one of silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), or palladium (Pd).

20. The light emitting diode according to claim 14, wherein the second conductivity type semiconductor layer has a c-plane as a growth plane and the monocrystalline ZnO of the ZnO transparent electrode has a wurtzite crystal structure.

21. A light emitting diode comprising:
a light emitting structure comprising a first conductivity type semiconductor layer, an active layer disposed on the first conductivity type semiconductor layer, and a second conductivity type semiconductor layer disposed on the active layer; and
a ZnO transparent electrode disposed on the second conductivity type semiconductor layer to form ohmic contact with the second conductivity type semiconductor layer and comprising monocrystalline ZnO;
wherein a diffraction angle of a peak of the ZnO transparent electrode obtained by XRD (X-Ray Diffraction) ω2θ scanning is in the range of ±1% with respect to a diffraction angle of a peak of the second conductivity type semiconductor layer obtained by XRD ω2θ scanning and a main peak of the ZnO transparent electrode obtained by XRD ω scanning has a full width at half maximum (FWHM) of 900 arc sec or less,
wherein the ZnO transparent electrode comprises a ZnO seed layer and a ZnO bulk layer disposed on the ZnO seed layer, the ZnO bulk layer having a greater thickness than the ZnO seed layer, and
wherein the ZnO seed layer comprises undoped ZnO and the ZnO bulk layer comprises monocrystalline ZnO doped with at least one of silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), or palladium (Pd).

22. The light emitting diode according to claim 21, wherein the diffraction angle of the peak of the ZnO transparent electrode obtained by XRD ω2θ scanning is in the range of ±0.5% with respect to the diffraction angle of the peak of the second conductivity type semiconductor layer obtained by XRD ω2θ scanning.

23. The light emitting diode according to claim 21, wherein the main peak of the ZnO transparent electrode obtained by XRD ω scanning has an FWHM of 870 arc sec or less.

24. The light emitting diode according to claim 21, wherein the ZnO transparent electrode has a thickness of 800 nm or more.

25. The light emitting diode according to claim 21, wherein the ZnO transparent electrode comprises a plurality of voids.

26. The light emitting diode according to claim 21, wherein the second conductivity type semiconductor layer has a c-plane as a growth plane and the monocrystalline ZnO of the ZnO transparent electrode has a wurtzite crystal structure.

* * * * *